US012707645B2

(12) United States Patent
Lee et al.

(10) Patent No.: US 12,707,645 B2
(45) Date of Patent: Aug. 11, 2026

(54) 3D FERROELECTRIC MEMORY DEVICES

(71) Applicant: Samsung Electronics Co., Ltd., Suwon-si (KR)

(72) Inventors: Bongyong Lee, Suwon-si (KR); Yongseok Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 489 days.

(21) Appl. No.: 18/192,994

(22) Filed: Mar. 30, 2023

(65) Prior Publication Data

US 2023/0413575 A1 Dec. 21, 2023

(30) Foreign Application Priority Data

Jun. 21, 2022 (KR) ........................ 10-2022-0075431

(51) Int. Cl.
*H10B 53/20* (2023.01)
*H10B 53/10* (2023.01)
*H10B 53/30* (2023.01)
*H10D 64/68* (2025.01)

(52) U.S. Cl.
CPC ............ *H10B 53/20* (2023.02); *H10B 53/10* (2023.02); *H10B 53/30* (2023.02); *H10D 64/689* (2025.01)

(58) Field of Classification Search
CPC ........ H10B 53/00; H10B 53/10; H10B 53/20; H10B 53/30; H10D 64/689
See application file for complete search history.

(56) References Cited

U.S. PATENT DOCUMENTS 10,600,468 B2 3/2020 Pan et al.
11,107,515 B2 8/2021 Derner et al.
11,170,836 B1 11/2021 Tang
11,171,157 B1 11/2021 Lai et al.
2007/0236979 A1* 10/2007 Takashima ............. H10B 53/20 257/E21.664

(Continued)

FOREIGN PATENT DOCUMENTS

CN 111326524 A * 6/2020 ........... H01L 21/768
CN 114121801 A * 3/2022 ......... H10D 84/0149

(Continued)

OTHER PUBLICATIONS

Office Action in Korean Appln. No. 10-2022-0075431, mailed on Jan. 19, 2026, 9 pages (with English translation).

*Primary Examiner* — Matthew E Warren
(74) *Attorney, Agent, or Firm* — Fish & Richardson P.C.

(57) ABSTRACT

A 3D FeRAM device includes a capacitor structure including a first capacitor electrode on a substrate, the first capacitor electrode extending in a vertical direction substantially perpendicular to an upper surface of the substrate, a ferroelectric pattern surrounding a sidewall of the first capacitor electrode, and second capacitor electrodes surrounding and contacting an outer sidewall of the ferroelectric pattern, the second capacitor electrodes being spaced apart from each other in the vertical direction, an access transistor including a channel layer on the first capacitor electrode, a gate insulation layer surrounding an outer sidewall of the channel layer, and a gate electrode surrounding an outer sidewall of the gate insulation layer, a conductive pad on the channel layer, a contact plug on the conductive pad, and a bit line on the contact plug.

12 Claims, 26 Drawing Sheets

(56) References Cited

U.S. PATENT DOCUMENTS

| | | | | |
|---|---|---|---|---|
| 2020/0185396 | A1* | 6/2020 | Juengling | H10B 12/31 |
| 2020/0411522 | A1 | 12/2020 | Tang et al. | |
| 2021/0074725 | A1 | 3/2021 | Lue | |
| 2021/0111179 | A1 | 4/2021 | Shivaraman et al. | |
| 2023/0101111 | A1* | 3/2023 | Shivaraman | H10D 1/716<br>257/295 |
| 2023/0217662 | A1* | 7/2023 | Kang | H10B 43/35<br>257/295 |
| 2023/0309317 | A1* | 9/2023 | Kim | H10B 53/10 |

FOREIGN PATENT DOCUMENTS

| | | | | |
|---|---|---|---|---|
| KR | 10-2012-0113338 A | | 10/2012 | |
| KR | 20230121270 A | * | 8/2023 | G11C 11/223 |
| WO | WO-2023168752 A1 | * | 9/2023 | H10D 30/67 |

* cited by examiner

3D FERROELECTRIC MEMORY DEVICES

CROSS-REFERENCE TO RELATED APPLICATION

This application claims priority under 35 U.S.C. § 119 to Korean Patent Application No. 10-2022-0075431, filed on Jun. 21, 2022 in the Korean Intellectual Property Office (KIPO), the disclosure of which is incorporated by reference herein in its entirety.

TECHNICAL FIELD

Some example embodiments of the inventive concepts relate to a 3D ferroelectric memory device.

DISCUSSION OF RELATED ART

A ferroelectric random access memory (FeRAM) device or a ferroelectric field effect transistor (FeFET) may be used as a memory device, which is simpler than a DRAM device, and a non-volatile memory device as a flash memory device. Recently, a 3-dimensional (3D) FeRAM device has been developed in order to have a high integration degree, however, an enhanced method of manufacturing the 3D FeRAM device is needed.

SUMMARY

Some example embodiments of the inventive concepts provide a 3D ferroelectric memory device having enhanced electrical characteristics.

According to some example embodiments of the inventive concepts, there is provided a 3D FeRAM device. The 3D FeRAM device may include a capacitor structure including a first capacitor electrode on a substrate, the first capacitor electrode extending in a vertical direction substantially perpendicular to an upper surface of the substrate, a ferroelectric pattern surrounding a sidewall of the first capacitor electrode, and second capacitor electrodes surrounding and contacting an outer sidewall of the ferroelectric pattern, the second capacitor electrodes being spaced apart from each other in the vertical direction, an access transistor including a channel layer on the first capacitor electrode, a gate insulation layer surrounding an outer sidewall of the channel layer, and a gate electrode surrounding an outer sidewall of the gate insulation layer, a conductive pad on the channel layer, a contact plug on the conductive pad, and a bit line on the contact plug.

According to some example embodiments of the inventive concepts, there is provided a 3D FeRAM device. The 3D FeRAM device may include a capacitor structure including first capacitor electrodes on a substrate, the first capacitor electrodes being spaced apart from each other in a vertical direction substantially perpendicular to an upper surface of the substrate, a ferroelectric pattern covering an upper surface, a lower surface, and a sidewall of each of the first capacitor electrodes, and a second capacitor electrode extending in the vertical direction through the first capacitor electrodes, an access transistor including a channel on the second capacitor electrode, a gate insulation layer surrounding an outer sidewall of the channel, and a gate electrode surrounding an outer sidewall of the gate insulation layer, a conductive pad on the channel, and a bit line electrically connected to the conductive pad.

According to some example embodiments of the inventive concepts, there is a 3D FeRAM device. The 3D FeRAM device may include first capacitor electrodes on a substrate, the first capacitor electrodes being spaced apart from each other in a vertical direction substantially perpendicular to an upper surface of the substrate, a second capacitor electrode extending in the vertical direction through the first capacitor electrodes, a ferroelectric pattern on a sidewall of the second capacitor electrode, the ferroelectric pattern contacting sidewalls of the first capacitor electrodes, a gate electrode on an uppermost one of the first capacitor electrodes, a channel layer extending through the gate electrode and contacting an upper surface of the second capacitor electrode, the channel layer having a cup shape, a filling layer including a sidewall and a lower surface, the sidewall and the lower surface of the filling layer being covered by the channel layer, a conductive pad contacting upper surfaces of the channel layer and the filling layer, a gate insulation layer surrounding an outer sidewall of the channel layer and a sidewall of the conductive pad, the gate insulation layer contacting a sidewall of the gate electrode, a contact plug on the conductive pad, and a bit line on the contact plug.

The 3D FeRAM device in accordance with some example embodiments may have an enhanced integration degree, and the electrical connection between the bit line and the access transistor may be enhanced.

DETAILED DESCRIPTION OF THE EMBODIMENTS

The above and other features of the inventive concepts will be more clearly understood by describing in detail some example embodiments thereof with reference to the accompanying drawings.

Hereinafter, in the specification (and not necessarily in the claims), two directions substantially parallel to an upper surface of a substrate and crossing each other may be defined as first and second directions D1 and D2, respectively, and a direction substantially perpendicular to the upper surface of the substrate may be defined as a third direction D3. In some example embodiments, the first and second directions D1 and D2 may be substantially perpendicular to each other.

Figure 1:
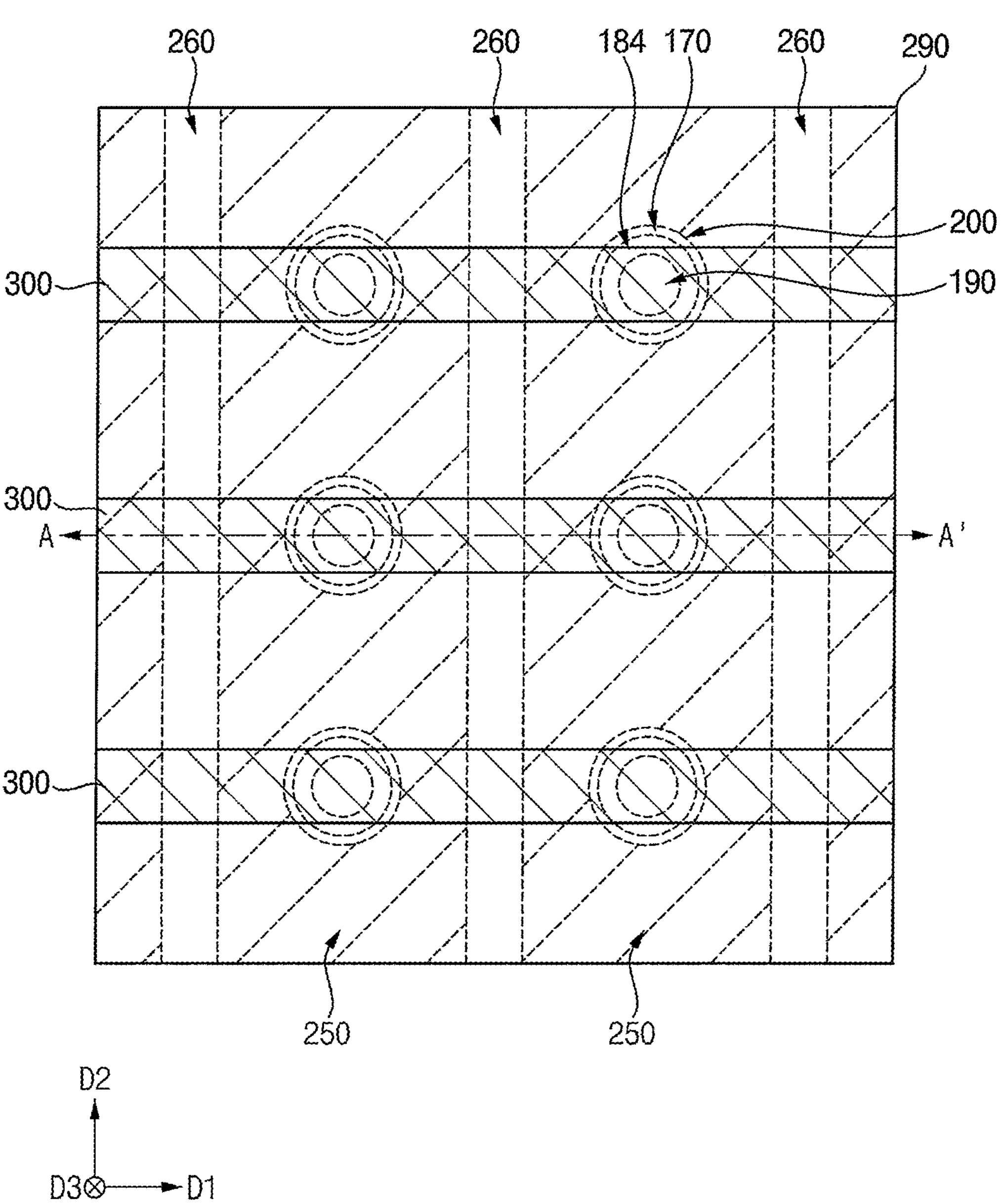
FIGS. 1 and 2 are a plan view and a cross-sectional view, respectively, illustrating a 3D ferroelectric random access memory (3D FeRAM) device in accordance with some example embodiments.
Figure 2:
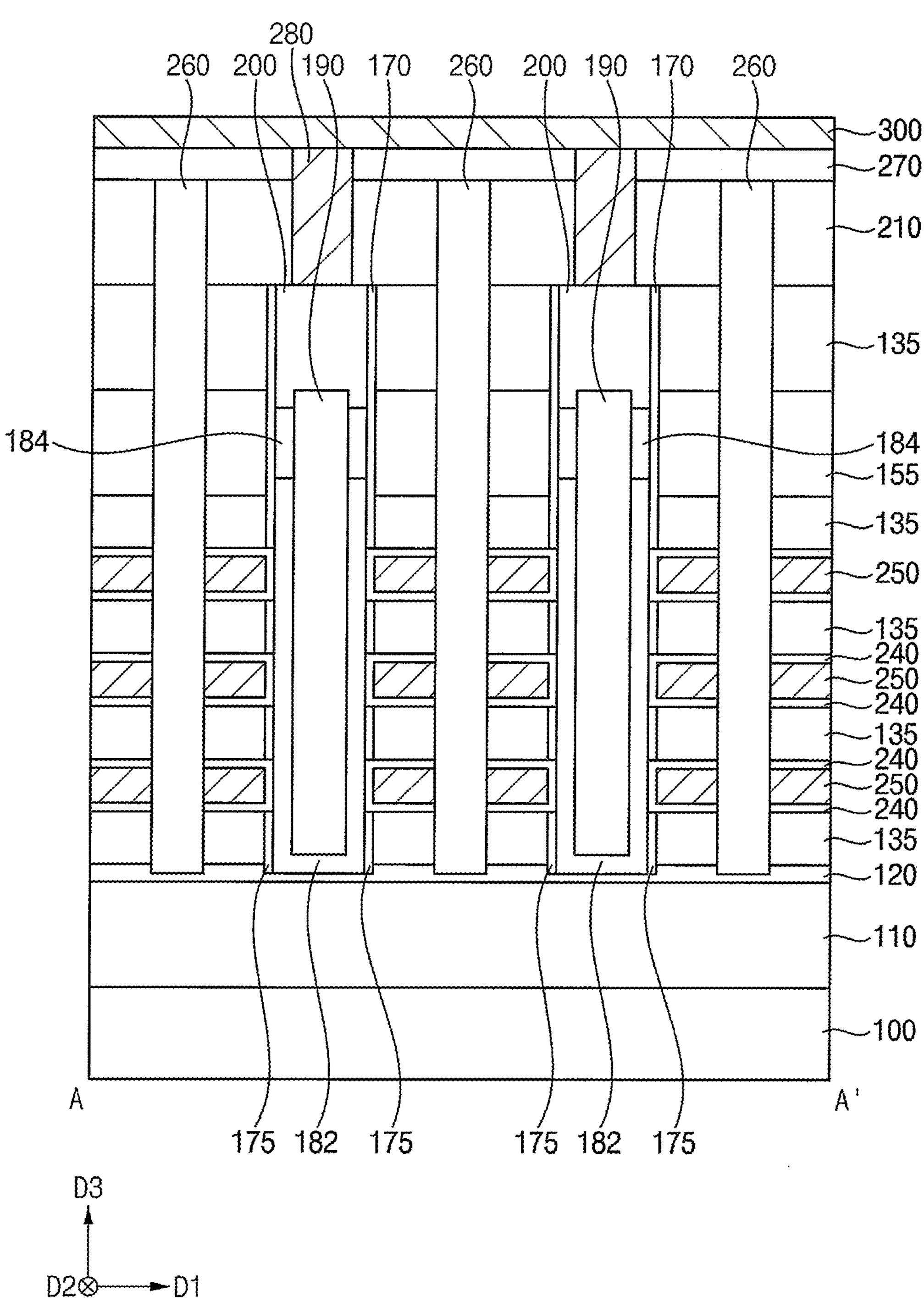

FIGS. 1 and 2 are a plan view and a cross-sectional view, respectively, illustrating a 3D ferroelectric random access memory (3D FeRAM) device in accordance with some example embodiments.

Referring to FIGS. 1 and 2, the 3D FeRAM device may include a first capacitor structure, a first access transistor, a first filling layer 190, a first conductive pad 200, a contact plug 280 and/or a bit line 300 on a substrate 100.

The 3D FeRAM device may further include first and/or second insulation patterns 135 and/or 260, first to fourth insulating interlayers 110, 210, 270 and/or 290, and/or an etch stop layer 120.

The substrate 100 may include a semiconductor material, e.g., silicon, germanium, silicon-germanium, etc., and/or a III-V group compound semiconductor, such as GaP, GaAs, GaSb, etc. In some example embodiments, the substrate 100 may be a silicon-on-insulator (SOI) substrate and/or a germanium-on-insulator (GOI) substrate.

The first insulating interlayer 110 and/or the etch stop layer 120 may be stacked on the substrate 100. The first insulating interlayer 110 may include an oxide, e.g., silicon oxide, and the etch stop layer 120 may include a metal oxide, e.g., aluminum oxide.

Various types of circuit patterns, e.g., transistors, contact plugs, wirings, etc., may be formed on the substrate 100, which may be covered by the first insulating interlayer 110.

The first capacitor structure may include second and/or third electrodes 182 and/or 250 and/or a first ferroelectric pattern 240 between the second and/or third electrodes 182 and/or 250. The second and/or third electrodes 182 and/or 250 may also be referred to as second and/or first capacitor electrodes 182 and/or 250, respectively.

In some example embodiments, the first capacitor electrode 250 may extend in the second direction D2, and a plurality of first capacitor electrodes 250 may be spaced apart from each other in the third direction D3. The first capacitor electrodes 250 disposed in the third direction D3 may form a first capacitor electrode group, and a plurality of first capacitor electrode groups may be spaced apart from each other in the first direction D1. The first capacitor electrode 250 may include, e.g., a metal, a metal nitride, a metal silicide, etc., and the second insulation pattern 260 may include an oxide, e.g., silicon oxide.

The first ferroelectric pattern 240 may cover upper and/or lower surfaces of the first capacitor electrode 250 and/or a sidewall of the first capacitor electrode 250 facing the second capacitor electrode 182. The first ferroelectric pattern 240 may include hafnium oxide doped with, e.g., zirconium (Zr), silicon (Si), aluminum (Al), yttrium (Y), gadolinium (Gd), lanthanum (La), scandium (Sc), strontium (Sr), etc.

The first insulation pattern 135 may be formed between neighboring ones of the first capacitor electrodes 250 in the third direction D3, and may contact the first ferroelectric patterns 240 covering upper and/or lower surfaces of the first capacitor electrodes 250. The first insulation pattern 135 may include an oxide, e.g., silicon oxide.

In some example embodiments, the second capacitor electrode 182 may extend in the third direction D3 through the first capacitor electrodes 250, and/or a plurality of second capacitor electrodes 182 may be spaced apart from each other in the second direction D2. That is, a plurality of second capacitor electrodes 182 may be disposed in the second direction D2 through the first capacitor electrode group.

In some example embodiments, the second capacitor electrode 182 may have a cup shape, and/or a lower surface of the second capacitor electrode 182 may contact an upper surface of the etch stop layer 120. A portion of an outer sidewall of the second capacitor electrode 182 may contact the first ferroelectric pattern 240. In some example embodiments, the second capacitor electrode 182 may include polysilicon doped with, e.g., n-type impurities.

The first filling layer 190 may have a pillar shape extending in the third direction D3, and a lower surface and a portion of a sidewall of the first filling layer 190 may be covered by the second capacitor electrode 182 having a cup shape. The first filling layer 190 may include an oxide, e.g., silicon oxide, and/or an insulating nitride, e.g., silicon nitride.

The first access transistor may include a first electrode 155, a first channel 184 extending through the first electrode 155, and/or a first gate insulation pattern 175 on an outer sidewall of the first channel 184 and/or a sidewall of the first electrode 155 facing the first channel 184. The first electrode 155 may also be referred to as a gate electrode 155.

In some example embodiments, the gate electrode 155 may extend in the second direction D2 on the first capacitor structure, and a plurality of gate electrodes 155 may be spaced apart from each other in the first direction D1 by the second insulation pattern 260. Each, or one or more, of the gate electrodes 155 may serve as a word line in the 3D FeRAM device. The gate electrode 155 may include, e.g., polysilicon doped with n-type impurities, a metal, a metal nitride, a metal silicide, etc.

In some example embodiments, the first channel 184 may have a ring shape, and may contact an upper surface of the second capacitor electrode 182 having a cup shape. An inner sidewall of the first channel 184 may contact a portion of a sidewall of the first filling layer 190.

In some example embodiments, a lower surface of the first channel 184 may be substantially coplanar with a lower surface of the gate electrode 155. Alternatively, the lower surface of the first channel 184 may be higher or lower than the lower surface of the gate electrode 155. FIG. 2 shows that the lower surface of the first channel 184 is higher than the lower surface of the gate electrode 155.

In some example embodiments, an upper surface of the first channel 184 may be substantially coplanar with an upper surface of the gate electrode 155. Alternatively, the upper surface of the first channel 184 may be higher or lower than the upper surface of the gate electrode 155. FIG. 2 shows that the upper surface of the first channel 184 is lower than the upper surface of the gate electrode 155.

In some example embodiments, the upper surface of the first channel 184 may be substantially coplanar with an upper surface of the first filling layer 190. Alternatively, the upper surface of the first channel 184 may be higher or lower than the upper surface of the first filling layer 190. FIG. 2 shows that the upper surface of the first channel 184 is lower than the upper surface of the first filling layer 190.

In some example embodiments, the first channel 184 may include undoped polysilicon and/or polysilicon lightly doped with p-type impurities.

The first gate insulation pattern 175 may contact not only the outer sidewall of the first channel 184 but also a portion of an outer sidewall of the second capacitor electrode 182. That is, a portion of the outer sidewall of the second capacitor electrode 182 at a height between neighboring ones of the first ferroelectric patterns 240 in the third direction D3 may contact the first gate insulation pattern 175. The first gate insulation pattern 175 may include an oxide, e.g., silicon oxide.

The first conductive pad 200 may contact the upper surfaces of the first channel 184 and/or the first filling layer 190, and/or a sidewall of the first conductive pad 200 may be covered by the first gate insulation pattern 175. The first conductive pad 200 may include polysilicon doped with, e.g., n-type impurities.

Each, or one or more, of the first conductive pad 200 and/or the second capacitor electrode 182 over and under, respectively, the first channel 184 may serve as a source/drain of the first access transistor.

The second to fourth insulating interlayers 210, 270 and/or 290 may be sequentially stacked on an uppermost one of the first insulation patterns 135, the first conductive pad 200 and/or the first gate insulation pattern 175, and may include an oxide, e.g., silicon oxide.

The contact plug 280 may extend through the second and/or third insulating interlayers 210 and/or 270, and may contact an upper surface of the first conductive pad 200.

The bit line 300 may be formed on the third insulating interlayer 270, and may extend through the fourth insulating interlayer 290. In some example embodiments, the bit line 300 may extend in the first direction D1, and may contact upper surfaces of the contact plugs 280 disposed in the first direction D1. A plurality of bit lines 300 may be spaced apart from each other in the second direction D2.

The contact plug 280 and the bit line 300 may include a metal, e.g., tungsten, copper, aluminum, titanium, tantalum, etc., a metal nitride and/or a metal silicide.

In the 3D FeRAM device, the first capacitor structure may be formed under the first access transistor, and the first capacitor structure may include a plurality of first capacitor electrodes 250 disposed in the third direction D3. Thus, the 3D FeRAM device may have an enhanced integration degree when compared to a 3D FeRAM device including one capacitor with one first access transistor.

As illustrated below with reference FIGS. 3 to 16, failure of electrical connection between the first channel 184 and the bit line 300 due to misalignment may be reduced, or prevented.

FIGS. 3 to 16 are plan views and cross-sectional views illustrating a method of manufacturing a 3D FeRAM device in accordance with some example embodiments. Particularly, FIGS. 3, 5, 9, 11, 13 and 15 are the plan views, FIGS. 4, 6-8, 10, 12, 14 and 16 are cross-sectional views taken along lines A-A' of corresponding plan views, respectively.

Figure 3:
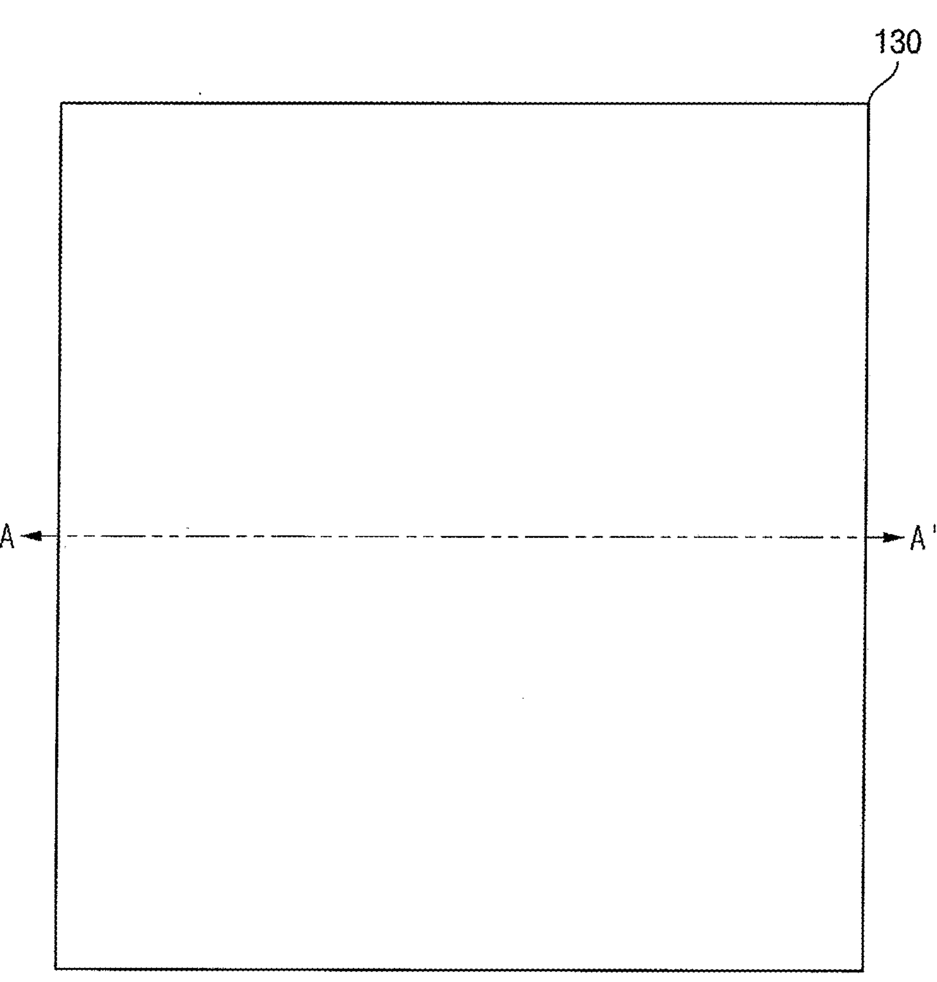
FIGS. 3 to 16 are plan views and cross-sectional views illustrating a method of manufacturing a 3D FeRAM device in accordance with some example embodiments.
Figure 3:
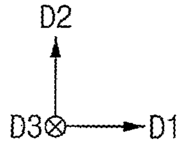
Figure 4:
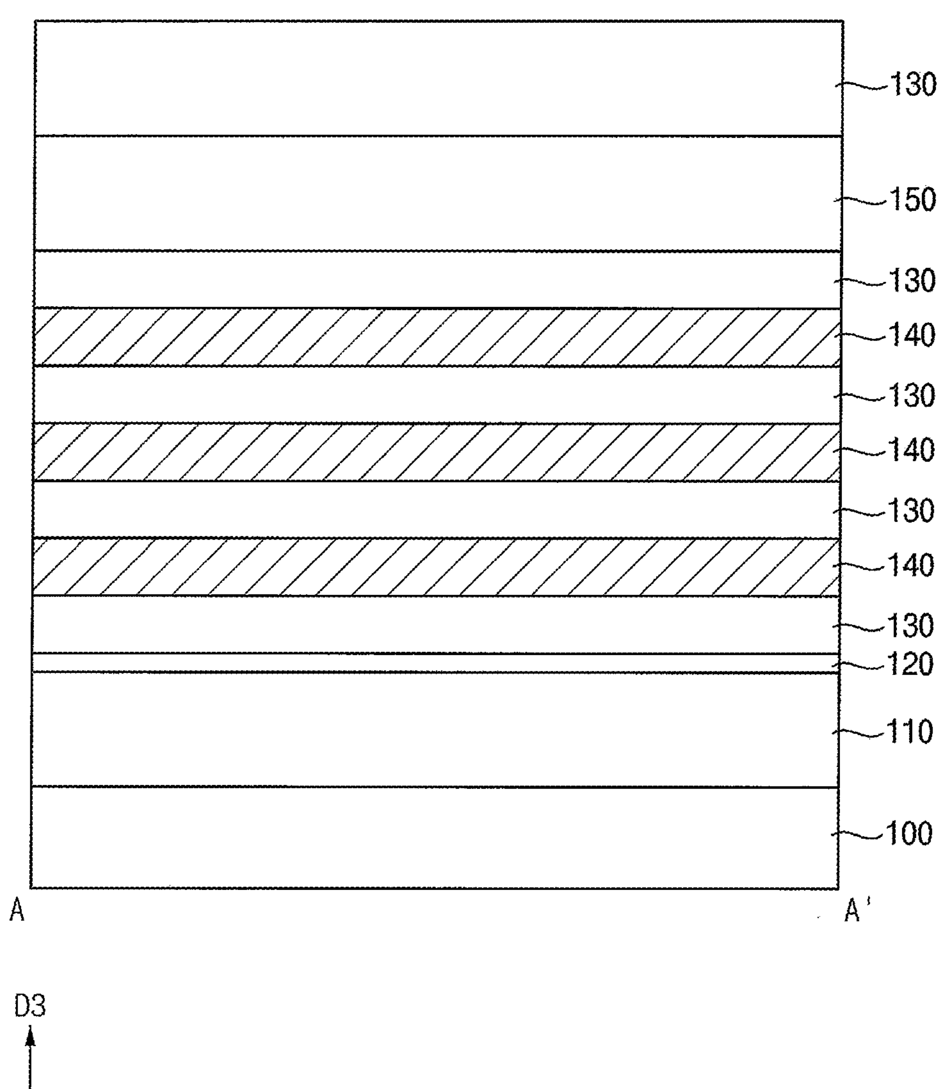

Referring to FIGS. 3 and 4, a first insulating interlayer 110, an etch stop layer 120 and/or a first insulation layer 130 may be sequentially stacked on a substrate 100, a first sacrificial layer 140 and the first insulation layer 130 may be alternately and repeatedly formed on the first insulation layer 130, a first electrode layer 150 may be formed on an uppermost one of the first insulation layers 130, and/or the first insulation layer 130 may be formed on the first electrode layer 150.

The first sacrificial layer 140 may include a material having an etching selectivity with respect to the first insulation layer 130, e.g., an insulating nitride such as silicon nitride.

FIG. 4 shows three first sacrificial layers 140 stacked on the substrate 100, however, the inventive concepts may not be limited thereto, and a plurality of first sacrificial layers 140 may be stacked on the substrate 100.

Various types of circuit patterns, e.g., transistors, contact plugs, wirings, etc., may be formed on the substrate 100, which may be covered by the first insulating interlayer 110.

Figure 5:
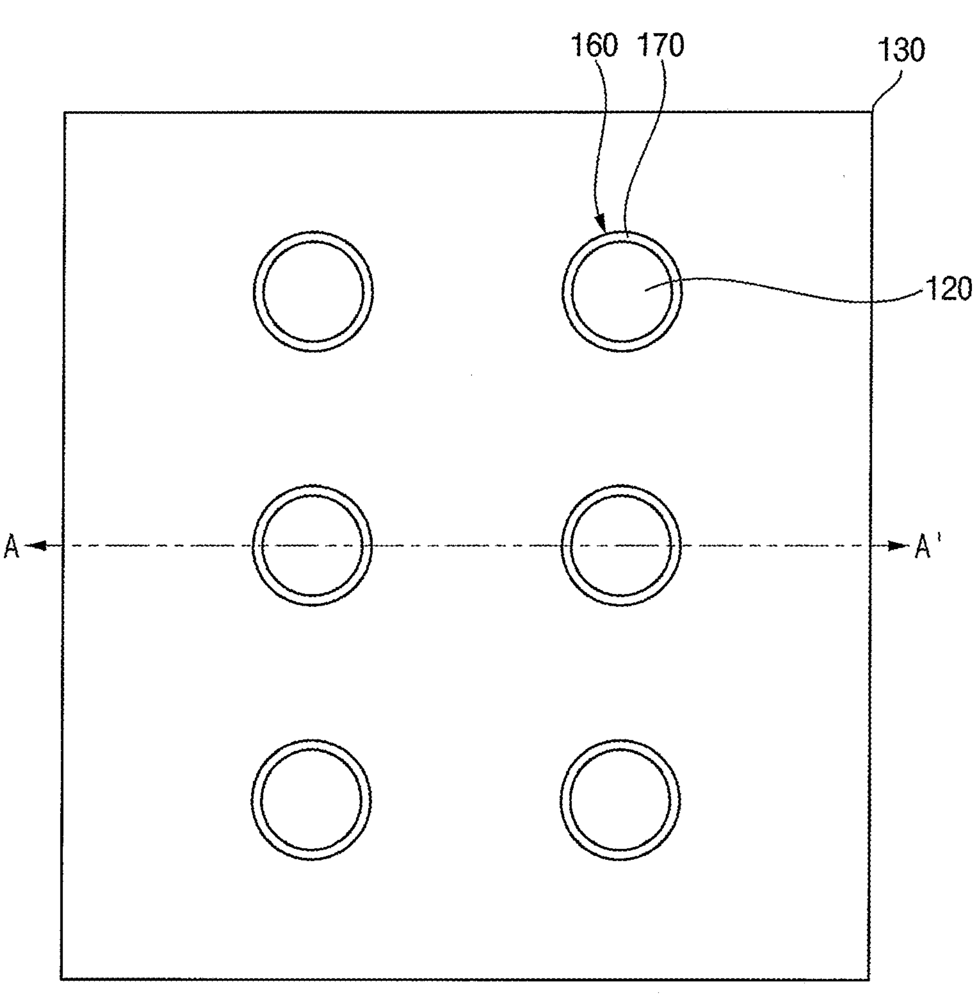
Figure 5:
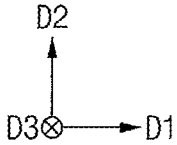
Figure 6:
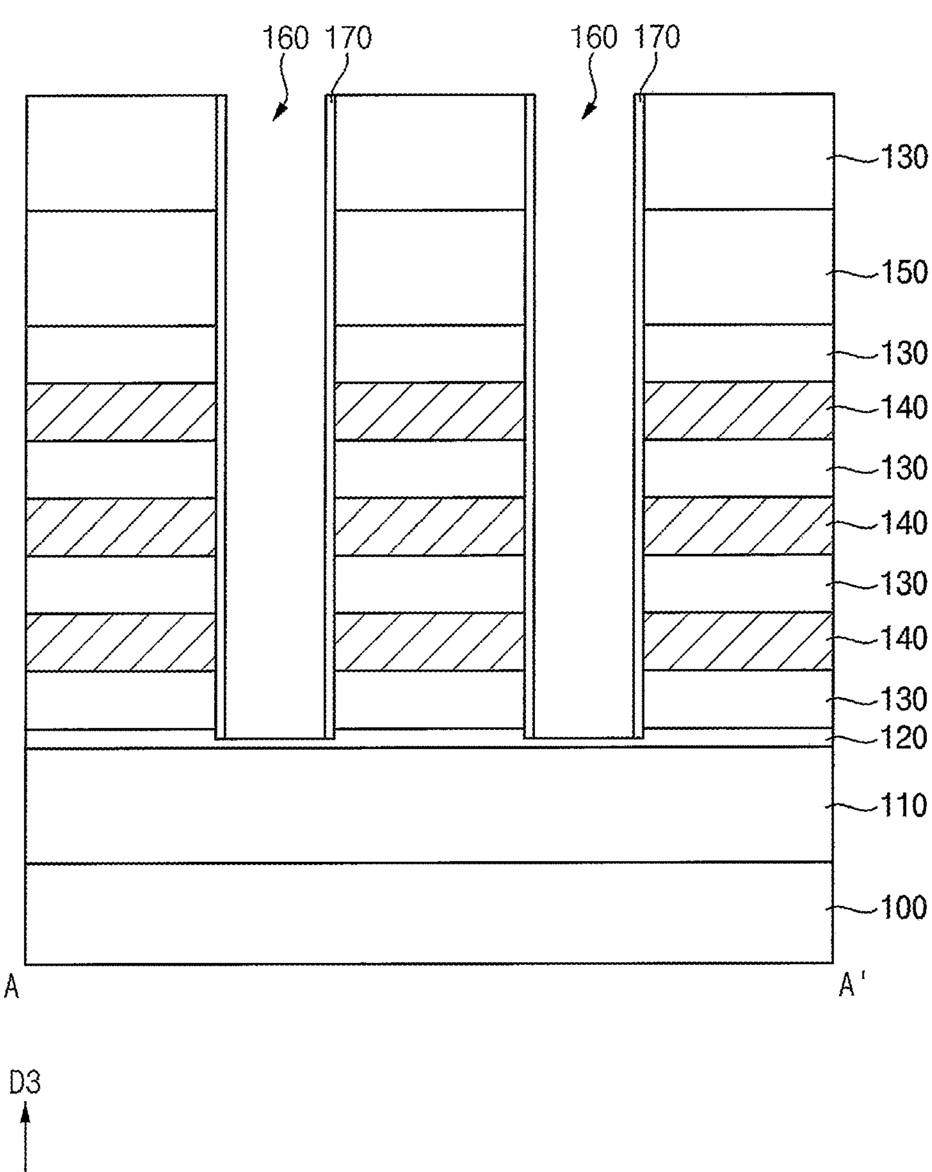

Referring to FIGS. 5 and 6, for example, a dry etching process may be performed to form a hole 160 through the first insulation layers 130, the first sacrificial layers 140 and/or the first electrode layer 150, which may expose an upper surface of the etch stop layer 120.

In some example embodiments, a plurality of holes 160 may be formed to be spaced apart from each other in the first and second directions D1 and D2, and may define a first hole array.

A first gate insulation layer 170 may be formed on a bottom and a sidewall of the first hole 160 and an upper surface of the uppermost one of the first insulation layers 130, and may be anisotropically etched.

Thus, portions of the first gate insulation layer 170 on the bottom of the first hole 160 and the upper surface of the uppermost one of the first insulation layers 130 may be reduced, or removed, and only a portion of the first gate insulation layer 170 on the sidewall of the first hole 160 may remain.

Figure 7:
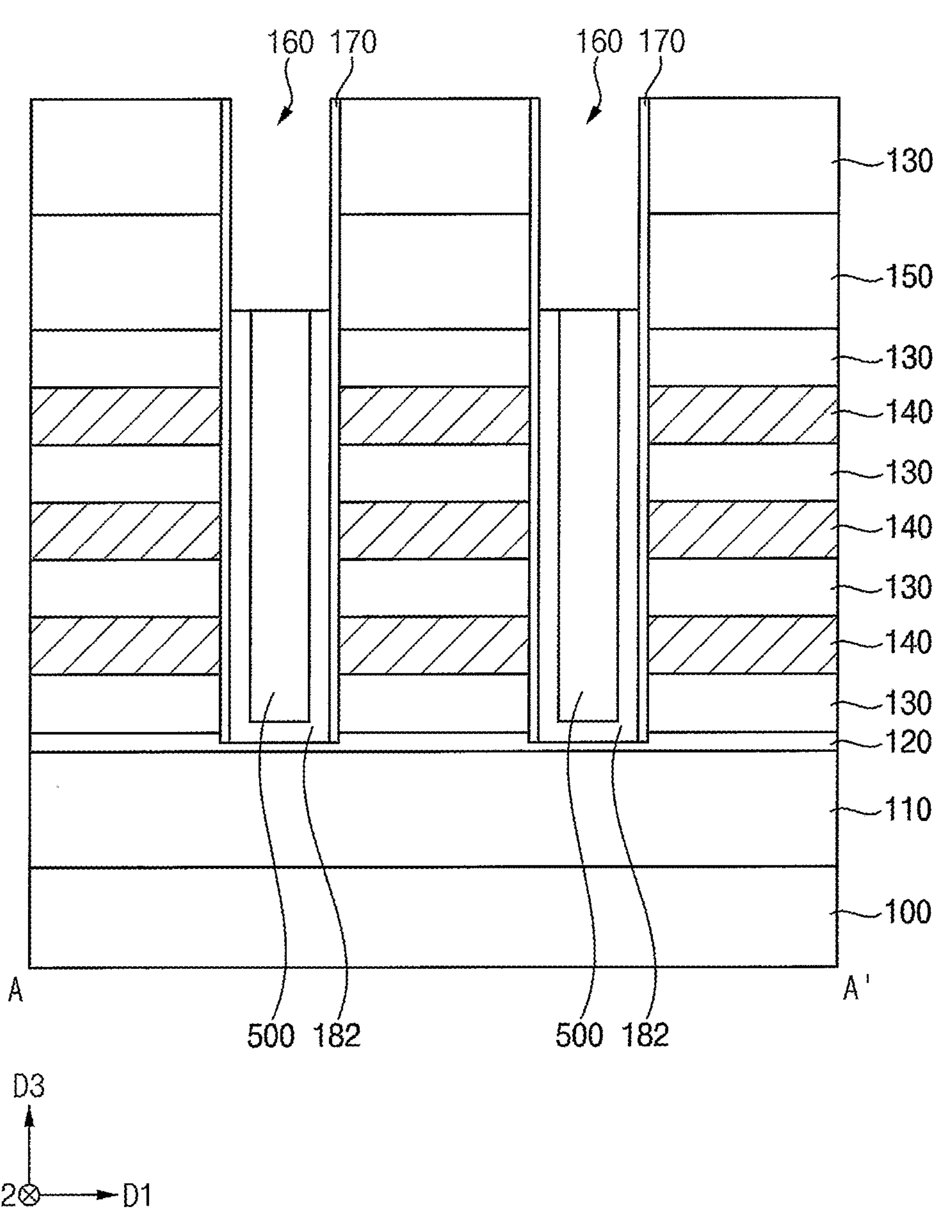

Referring to FIG. 7, a second electrode layer may be formed on an inner sidewall of the first gate insulation layer 170, the exposed upper surface of the etch stop layer 120 and the upper surface of the uppermost one of the first insulation layers 130, and a second sacrificial layer may be formed on the second electrode layer to fill a remaining portion of the first hole 160.

In some example embodiments, the second electrode layer may include polysilicon doped with, e.g., n-type impurities, and the second sacrificial layer may include, e.g., spin-on-hardmask (SOH), amorphous carbon layer (ACL), etc.

An upper portion of the second sacrificial layer may be reduced, or removed, by, e.g., a dry etching process and/or a wet etching process to form a second sacrificial pattern 500. In some example embodiments, an upper surface of the second sacrificial pattern 500 may be substantially coplanar with a lower surface of the first electrode layer 150. Alternatively, the upper surface of the second sacrificial pattern 500 may be higher or lower than the lower surface of the first electrode layer 150.

An upper portion of the second electrode layer, particularly, a portion of the second electrode layer higher than the upper surface of the second sacrificial pattern 500 may be reduced, or removed, by, e.g., a wet etching process to form a second electrode 182.

Figure 8:
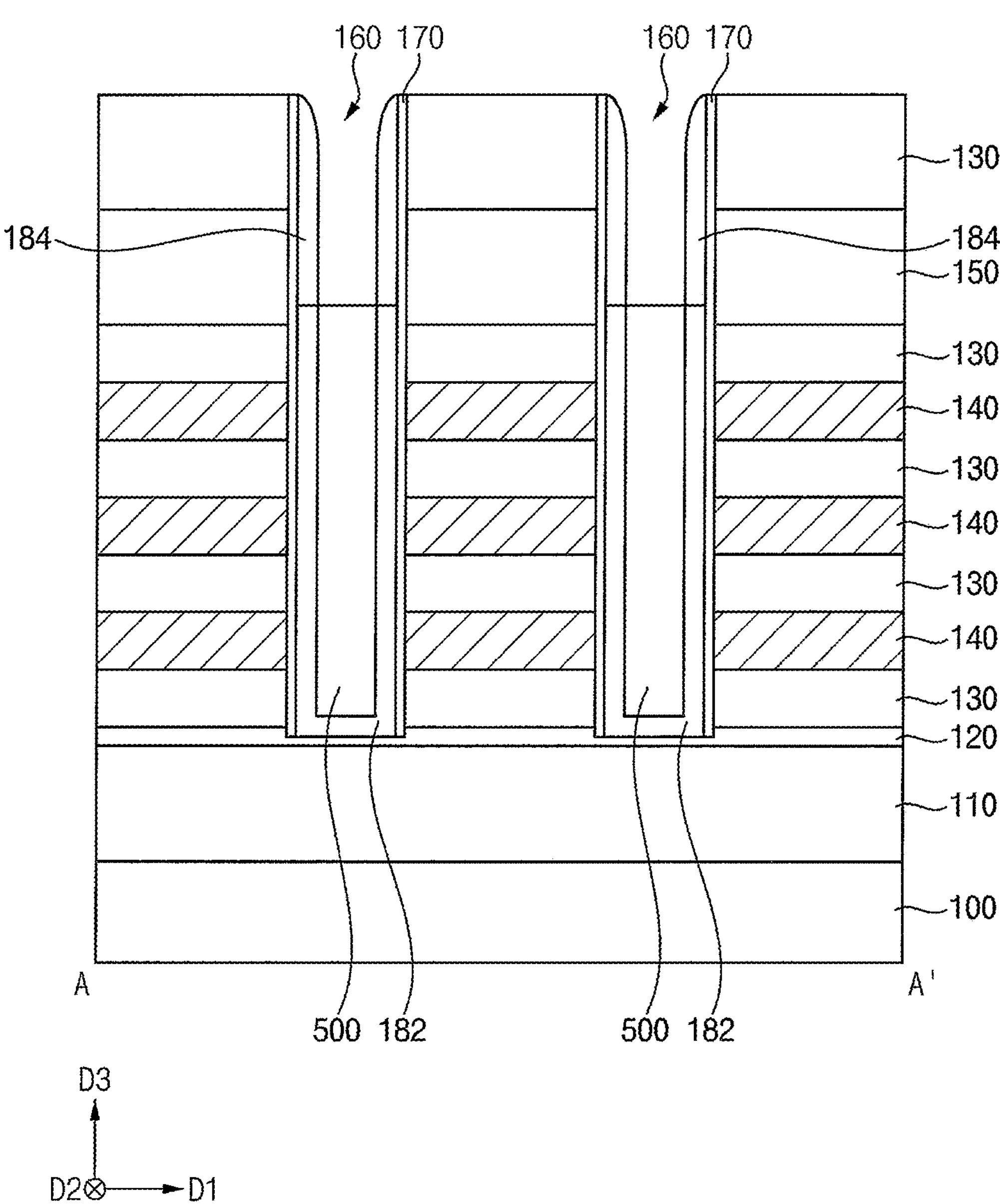

Referring to FIG. 8, a first channel layer may be formed on upper surfaces of the second electrode 182 and/or the second sacrificial pattern 500, an upper portion of the inner sidewall of the first gate insulation layer 170 that is not covered by the second electrode 182, and/or the upper surface of the uppermost one of the first insulation layers 130, and may be anisotropically etched.

Thus, a first channel 184 may be formed on the upper portion of the inner sidewall of the first gate insulation layer 170, and an upper surface of the second sacrificial pattern 500 may be exposed.

In some example embodiments, the first channel 184 may include undoped polysilicon and/or polysilicon lightly doped with p-type impurities.

Figure 9:
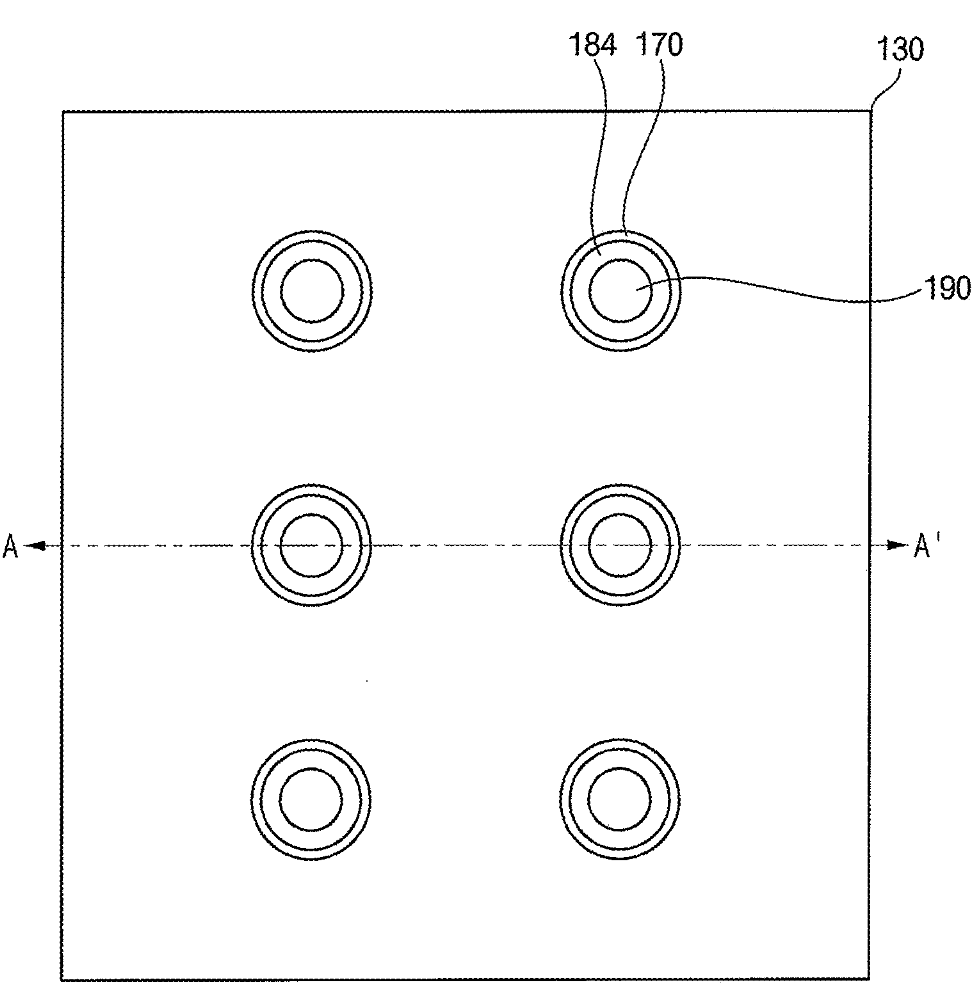
Figure 9:
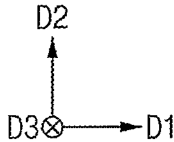
Figure 10:
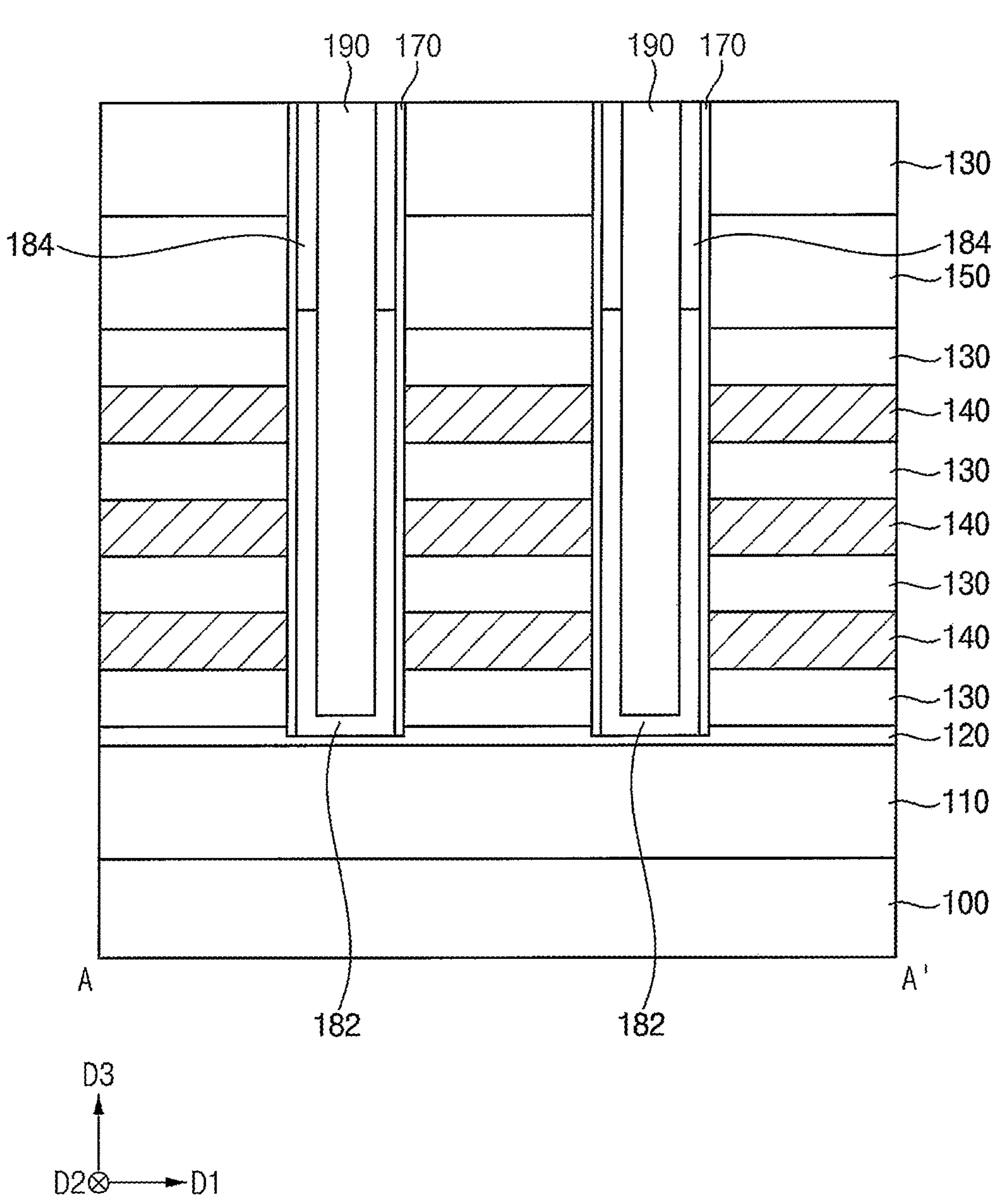

Referring to FIGS. 9 and 10, the exposed second sacrificial pattern 500 may be reduced, or removed, by, e.g., an ashing process and/or a stripping process to expose a surface of the second electrode 182.

A first filling layer 190 may be formed on the second electrode 182, the first channel 184 and/or the uppermost one of the first insulation layers 130 to fill a remaining portion of the first hole 160, and a planarization process may be performed on the first filling layer 190 until the upper surface of the uppermost one of the first insulation layers 130. Thus, the first filling layer 190 extending in the third direction D3, the second electrode 182 covering a lower portion of a sidewall and a lower surface of the first filling layer 190, the first channel 184 covering an upper portion of the sidewall of the first filling layer 190, and/or the first gate insulation layer 170 covering outer sidewalls of the second electrode 182 and/or the first channel 184 may be formed in the first hole 160.

The planarization process may include, e.g., a chemical mechanical polishing (CMP) process and/or an etch back process.

The first channels 184 in the first holes 160, respectively, may be disposed in the first and second directions D1 and D2 to define a first channel array. The first channel array may include a plurality of first channel columns arranged in the first direction D1, and each, or one or more, of the plurality of first channel columns may include a plurality of first channels 184 disposed in the second direction D2.

Figure 11:
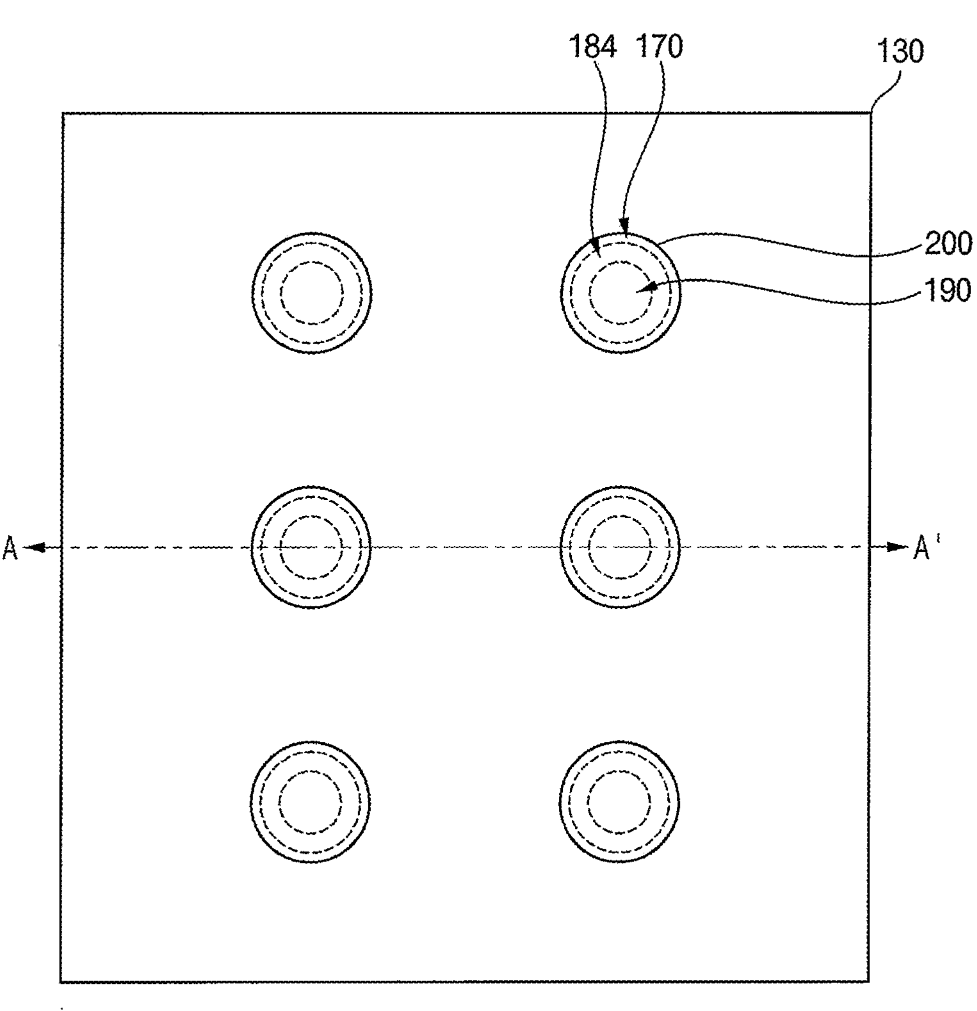
Figure 11:
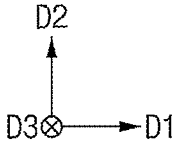
Figure 12:
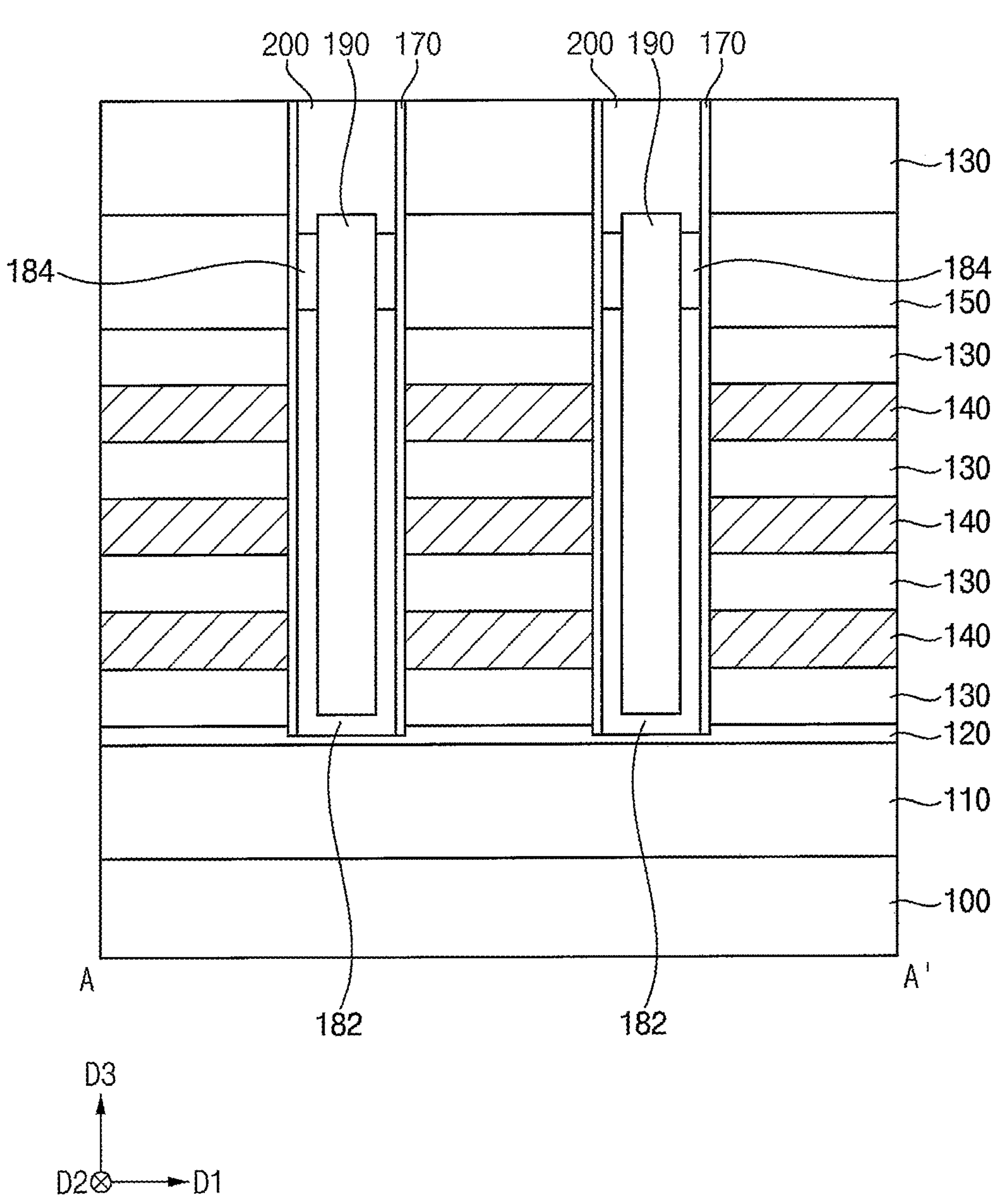

Referring to FIGS. 11 and 12, upper portions of the first filling layer 190 and/or the first channel 184 may be reduced, or removed, to form a first recess, and a first conductive pad 200 may be formed in the first recess.

In some example embodiments, the upper portion of the first filling layer 190 may be reduced, or removed, by, e.g., a dry etching process and/or a wet etching process, and/or the upper portion of the first channel 184 may be reduced, or removed, by, e.g., a dry etching process and/or a wet etching process, so that an uppermost surface of the first channel 184 may be lower than an upper surface of the first filling layer 190. Alternatively, the uppermost surface of the first channel 184 may be substantially coplanar with or higher than the upper surface of the first filling layer 190.

In some example embodiments, a height of an upper surface of the first channel 184 may be substantially equal or similar to a height of an upper surface of the first electrode layer 150.

The first conductive pad 200 may be formed by forming a first conductive pad layer on the first channel 184, the first filling layer 190, the first gate insulation layer 170 and/or the uppermost one of the first insulation layers 130 to fill the first recess, and planarizing the first conductive pad layer until the upper surface of the uppermost one of the first insulation layers 130 is exposed.

A plurality of first conductive pads 200 on the first channels 184, respectively, may be disposed in the first and second directions D1 and D2 to define a first conductive pad array.

Figure 13:
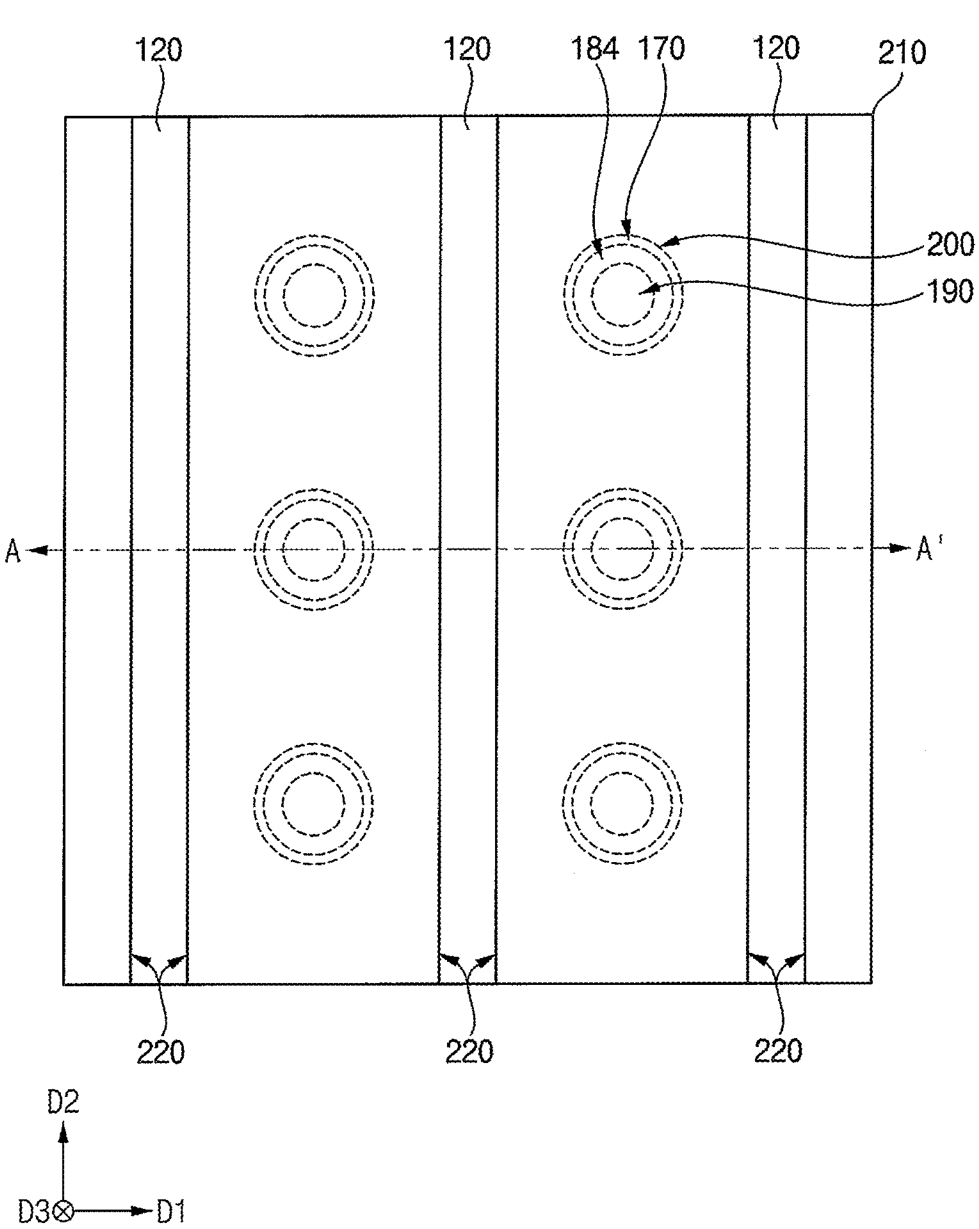
Figure 14:
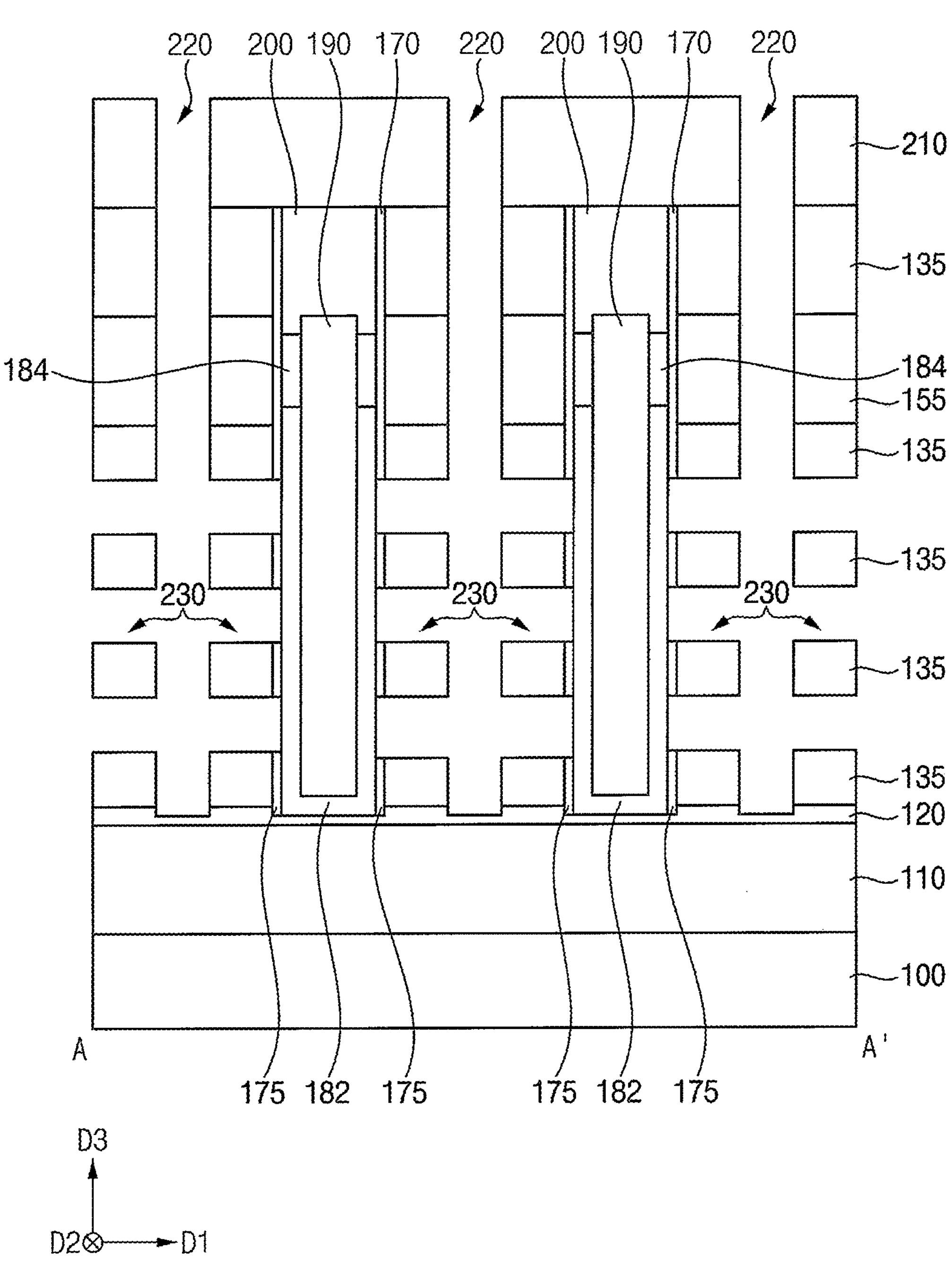

Referring to FIGS. 13 and 14, a second insulating interlayer 210 may be formed on the uppermost one of the first insulation layers 130, the first conductive pad 200 and/or the first gate insulation layer 170, and for example, a dry etching process may be performed to form an opening 220 through the second insulating interlayer 210, the first insulation layers 130, the first sacrificial layers 140 and/or the first electrode layer 150 to expose an upper surface of the etch stop layer 120.

In some example embodiments, the opening 220 may extend in the second direction D2, and a plurality of openings 220 may be spaced apart from each other in the first direction D1. Each, or one or more, of the openings 220 may be formed between neighboring ones of the first channel columns in the first direction D1.

As the opening 220 is formed, the first insulation layer 130, the first sacrificial layer 140 and the first electrode layer 150 may be divided into first insulation patterns 135, first sacrificial patterns and/or first electrodes 155, respectively, in the first direction D1.

For example, a wet etching process may be performed to remove the first sacrificial pattern exposed by the opening 220 to form a gap 230.

As the first sacrificial pattern is reduced, or removed, an outer sidewall of the first gate insulation layer 170 may be partially exposed by the gap 230, and a portion of the first gate insulation layer 170 exposed by the gap 230 may also be reduced, or removed.

Thus, the gap 230 may be enlarged in a horizontal direction substantially parallel to an upper surface of the substrate 100, and a portion of the first gate insulation layer 170 adjacent to the gap 230 may be reduced, or removed, so that the first gate insulation layer 170 extending in the third direction D3 may be divided into a plurality of first gate insulation patterns 175. Additionally, an outer sidewall of the second electrode 182 may be partially exposed.

Figure 15:
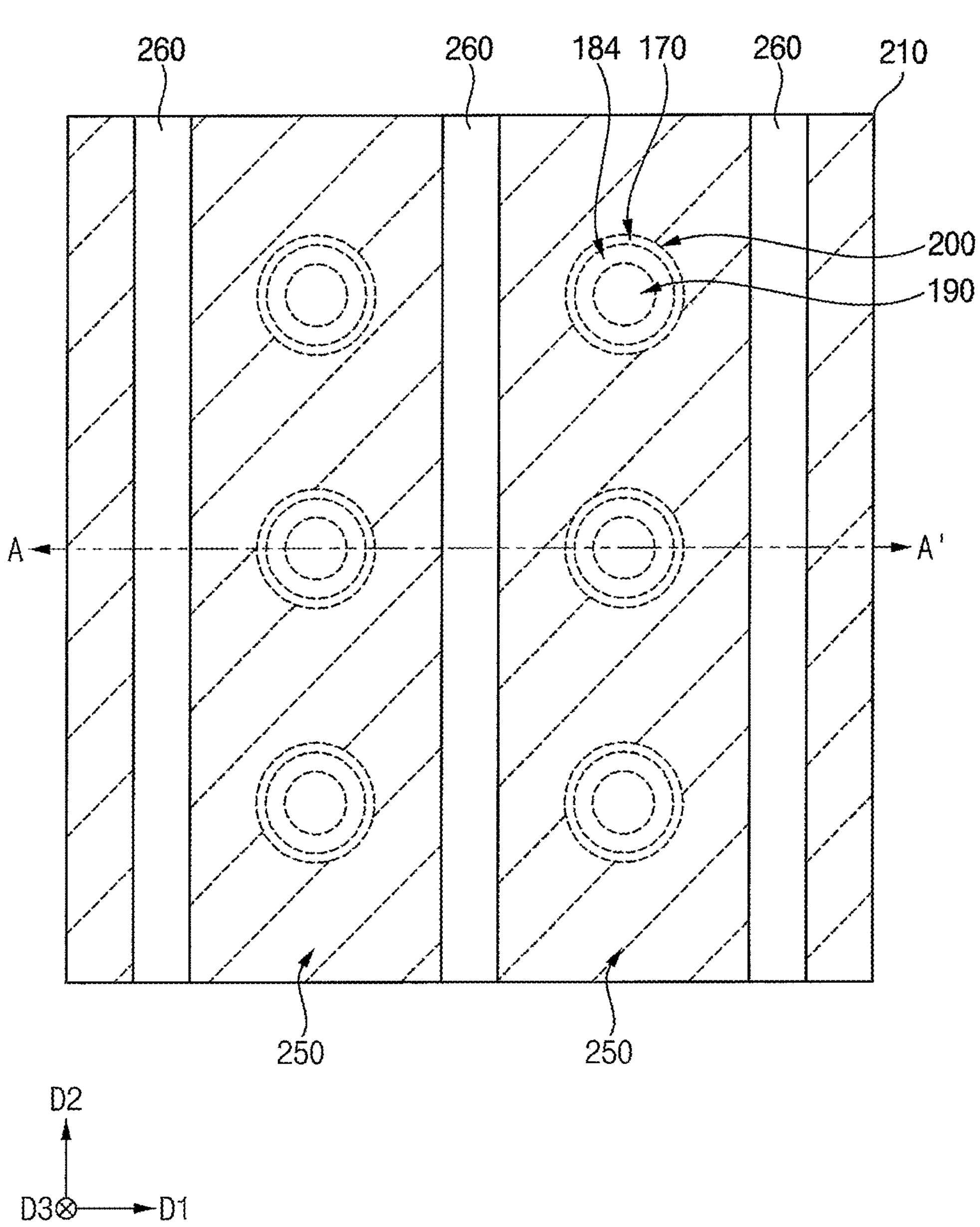
Figure 16:
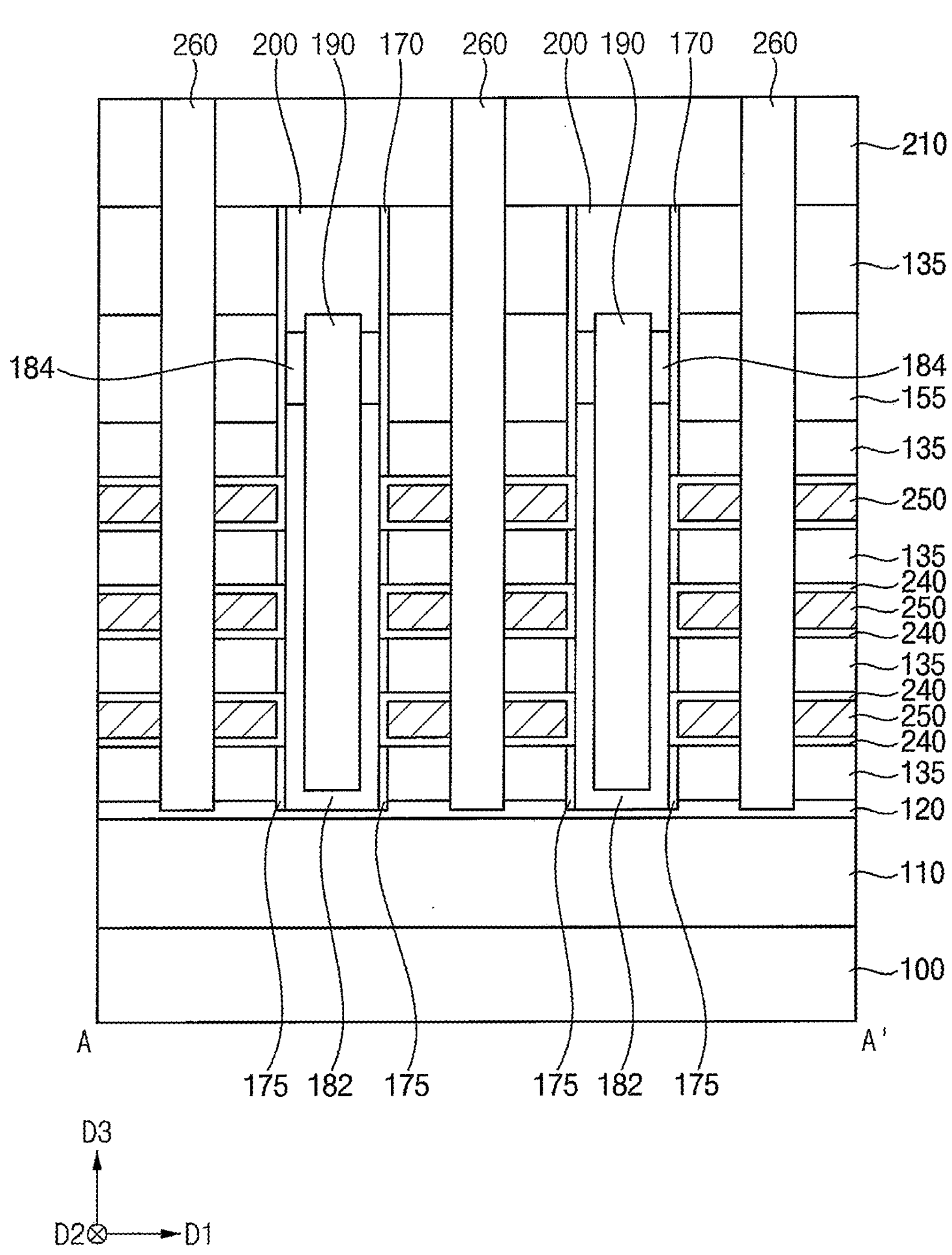

Referring to FIGS. 15 and 16, a first ferroelectric layer may be formed on lower and upper surfaces of the first insulation pattern 135, lower and upper surfaces of the first gate insulation pattern 175 and the outer sidewall of the second electrode 182, which are exposed by the gap 230, a sidewall of the first insulation pattern 135, a sidewall of the first electrode 155 and an upper surface of the etch stop layer 120, which are exposed by the opening 220, and an upper surface of the second insulating interlayer 210, and a third electrode layer may be formed on the first ferroelectric layer to fill a remaining portion of the gap 230.

For example, a wet etching process may be performed on the third electrode layer and the first ferroelectric layer to form a third electrode 250 and a first ferroelectric pattern 240 covering lower and/or upper surfaces and a sidewall of the second electrode 182 in the gap 230.

A second insulation pattern 260 may be formed in the opening 220.

Referring to FIGS. 1 and 2 again, a third insulating interlayer 270 may be formed on the second insulating interlayer 210 and the second insulation pattern 260, and a contact plug 280 may be formed through the second and/or third insulating interlayers 210 and/or 270 to contact an upper surface of the first conductive pad 200.

A plurality of contact plugs 280 on the first conductive pads 200, respectively, may be disposed in the first and/or second directions D1 and/or D2 to define a contact plug array. The contact plug array may include a plurality of contact plug columns disposed in the first direction D1, and each, or one or more, of the plurality of contact plug columns may include a plurality of contact plugs 280 disposed in the second direction D2.

A fourth insulating interlayer 290 may be formed on the third insulating interlayer 270 and the contact plug 280, and a bit line 300 may be formed through the fourth insulating interlayer 290 to contact an upper surface of the contact plug 280.

In some example embodiments, the bit line 300 may extend in the first direction D1, and may contact one contact plug 280 included in each, or one or more, of the contact plug columns.

By the above processes, the 3D FeRAM device may be manufactured.

As illustrated above, the first gate insulation layer 170 may be formed on the sidewall of the first hole 160, the second electrode 182 and/or the first channel 184 may be formed on the inner sidewall of the first gate insulation layer 170, the upper portion of the first channel 184 may be reduced, or removed, to form the first recess, and/or the first conductive pad 200 may be formed in the first recess. Additionally, the contact plug 280 and/or the bit line 300 may be formed on the first conductive pad 200.

For example, if the bit line 300 is formed on the substrate 100, a layer structure for forming the first access transistor and/or the first capacitor structure is formed on the bit line 300, the layer structure is reduced, or removed, by an etching process to form a hole exposing the bit line 300, and the channel is formed in the hole, during the etching process, misalignment may occur so that the hole may not expose the bit line 300, and thus failure of electrical connection between the channel and the bit line 300 may occur.

However, in some example embodiments, after forming the first channel 184 and the first conductive pad 200 in the first hole 160, the bit line 300 may be formed to be electrically connected to the channel 184 via the contact plug 280, so that failure of electrical connection between the first channel 184 and the bit line 300 due to the misalignment may be reduced or eliminated.

Additionally, the first gate insulation layer 170, the second electrode 182 and/or the first channel 184 may be formed in the first hole 160, so that forming the first gate insulation layer 170, the second electrode 182 and/or the first channel 184 may be relatively simple and easy when compared to forming the first gate insulation layer 170, the second electrode 182 and/or the first channel 184 by respective processes.

Figure 17:
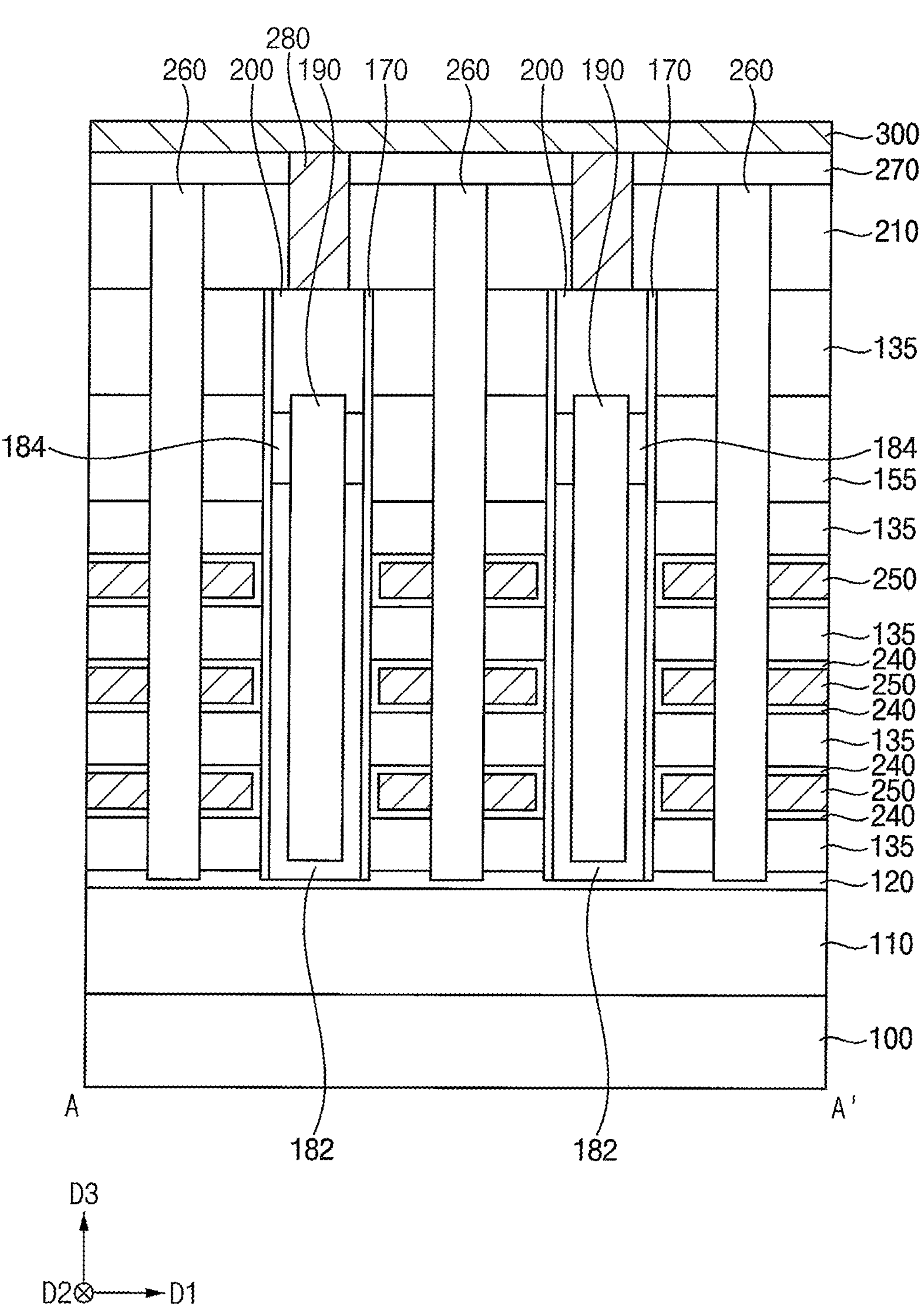
FIG. 17 is a cross-sectional view illustrating a 3D FeRAM device in accordance with some example embodiments.

FIG. 17 is a cross-sectional view illustrating a 3D FeRAM device in accordance with some example embodiments, which may correspond to FIG. 2.

This 3D FeRAM device may be substantially the same as or similar to that of FIGS. 1 and 2, except for including the first gate insulation layer 170 instead of the first gate insulation pattern 175.

Referring to FIG. 17, the 3D FeRAM device may include the first gate insulation layer 170 extending in the third direction D3, instead of the first gate insulation patterns 175 spaced apart from each other in the third direction D3 on sidewalls of the second electrode 182, the first channel 184 and/or the first conductive pad 200.

This 3D FeRAM device may be manufactured by not removing the portion of the first gate insulation layer 170 exposed by the gap 230.

As the 3D FeRAM device includes the first gate insulation layer 170 instead of the first gate insulation patterns 175, the first gate insulation layer 170 and/or the first ferroelectric pattern 240 may be stacked between the second and/or third electrodes 182 and/or 250 in a horizontal direction substantially parallel to the upper surface of the substrate 100.

Figure 18:
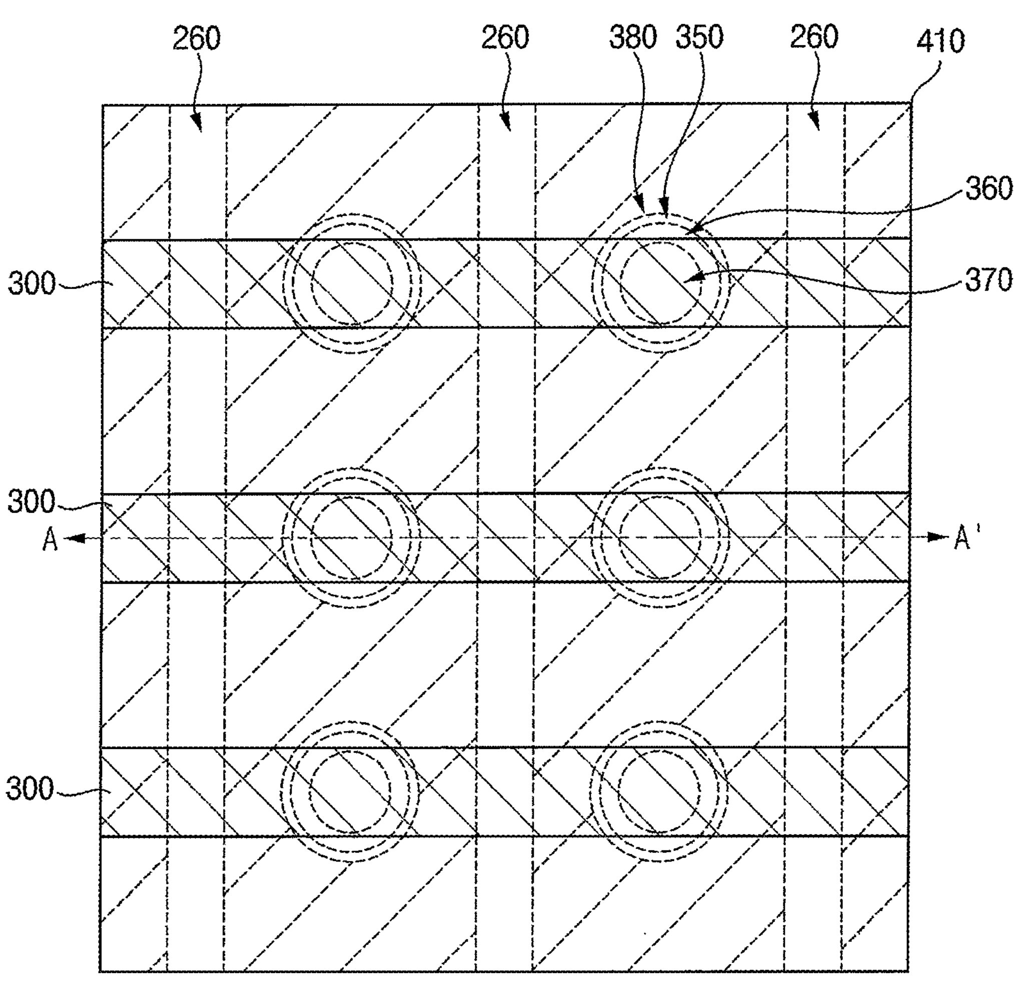
FIGS. 18 and 19 are a plan view and a cross-sectional view, respectively, illustrating a 3D FeRAM device in accordance with some example embodiments.
Figure 18:
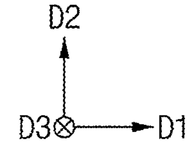
Figure 19:
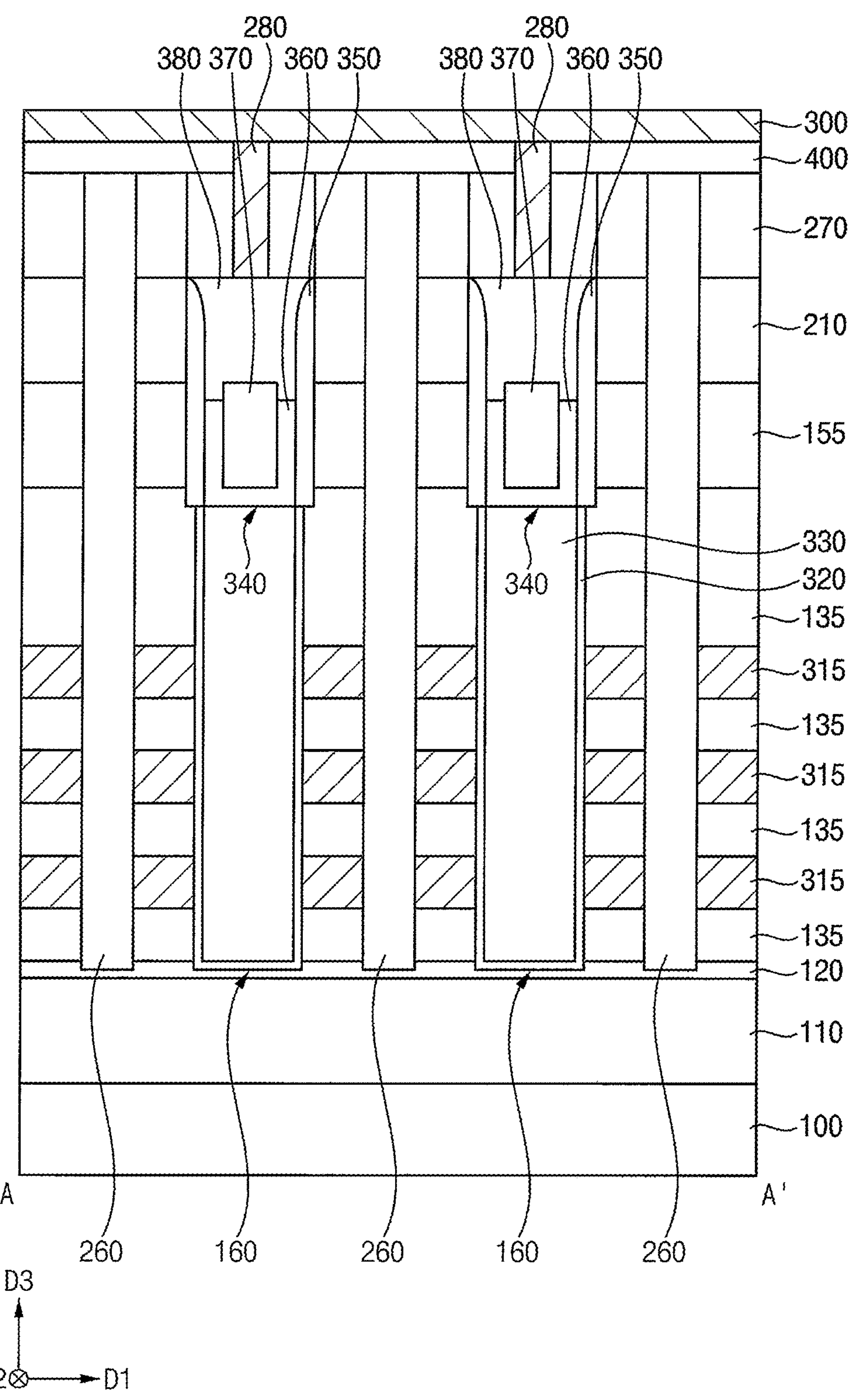

FIGS. 18 and 19 are a plan view and a cross-sectional view, respectively, illustrating a 3D FeRAM device in accordance with some example embodiments.

This 3D FeRAM device may be substantially the same as or similar to that of FIGS. 1 and 2, except for some elements. Thus, like reference numerals refer to like elements, and repeated explanations thereof are omitted herein.

Referring to FIGS. 18 and 19, The 3D FeRAM device may include a second capacitor structure, a second access transistor, a second filling layer 370, a second conductive pad 380, the contact plug 280 and/or the bit line 300.

The second capacitor structure may include fourth and/or fifth electrodes 315 and/or 330, and a second ferroelectric layer 320 between the fourth and/or fifth electrodes 315 and/or 330. The fourth and/or fifth electrodes 315 and/or 330 may also be referred to as third and/or fourth capacitor electrodes 315 and/or 330, respectively.

In some example embodiments, the third capacitor electrode 315 may extend in the second direction D2, and a plurality of third capacitor electrodes 315 may be spaced apart from each other in the third direction D3. The third capacitor electrodes 315 disposed in the third direction D3 may form a third capacitor electrode group, and a plurality of third capacitor electrode groups may be spaced apart from each other in the first direction D1 by the second insulation pattern 260. The third capacitor electrode 315 may include polysilicon doped with, e.g., n-type impurities.

In some example embodiments, the fourth capacitor electrode 330 may extend in the third direction D3 through the third capacitor electrodes 315, and a plurality of fourth capacitor electrodes 330 may be spaced apart from each other in the second direction D2. That is, a plurality of fourth capacitor electrodes 330 may be disposed in the second direction D2 through the third capacitor electrode group.

In some example embodiments, the fourth capacitor electrode 330 may have a pillar shape, and a lower surface and a sidewall of the fourth capacitor electrode 330 may be covered by the second ferroelectric layer 320. In some example embodiments, the fourth capacitor electrode 330 may include, e.g., polysilicon doped with n-type impurities, a metal, a metal nitride, a metal silicide, etc.

The second access transistor may include the first electrode 155, a second channel layer 360 extending through the first electrode 155, and/or a second gate insulation layer 350 on the outer sidewall of the first channel 184 and the sidewall of the first electrode 155 facing the first channel 184. The first electrode 155 may also be referred to as the gate electrode 155, and may serve as a word line in the 3D FeRAM device.

In some example embodiments, the second channel layer 360 may have a cup shape, and may contact an upper surface of the fourth capacitor electrode 330. Additionally, an inner sidewall of the second channel layer 360 may contact a portion of a sidewall of the second filling layer 370.

The second conductive pad 380 may contact upper surfaces of the second channel layer 360 and/or the second filling layer 370, and a sidewall of the second conductive pad 380 may be covered by the second gate insulation layer 350.

Each, or one or more, of the second conductive pad 380 and/or the fourth capacitor electrode 330 over and under, respectively, the second channel layer 360 included in the second access transistor may serve as a source/drain of the second access transistor.

Figure 20:
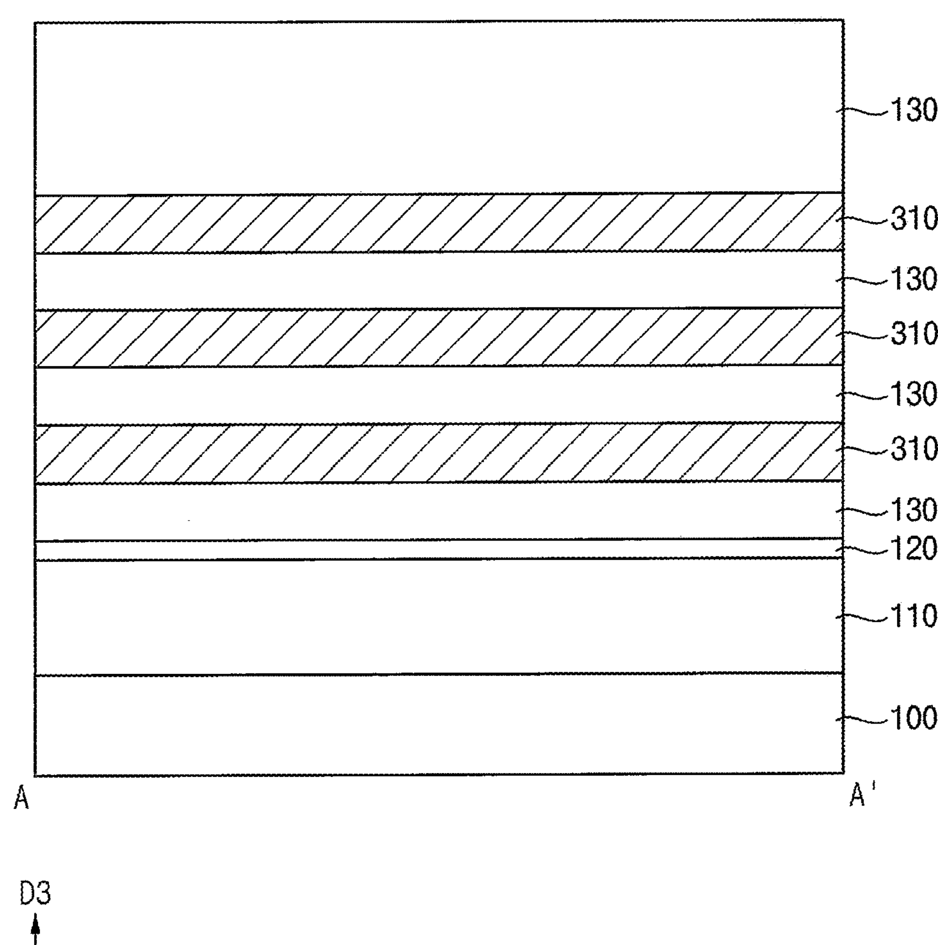
FIGS. 20 to 25 are plan views and cross-sectional views illustrating a method of manufacturing a 3D FeRAM device in accordance with some example embodiments.
Figure 21:
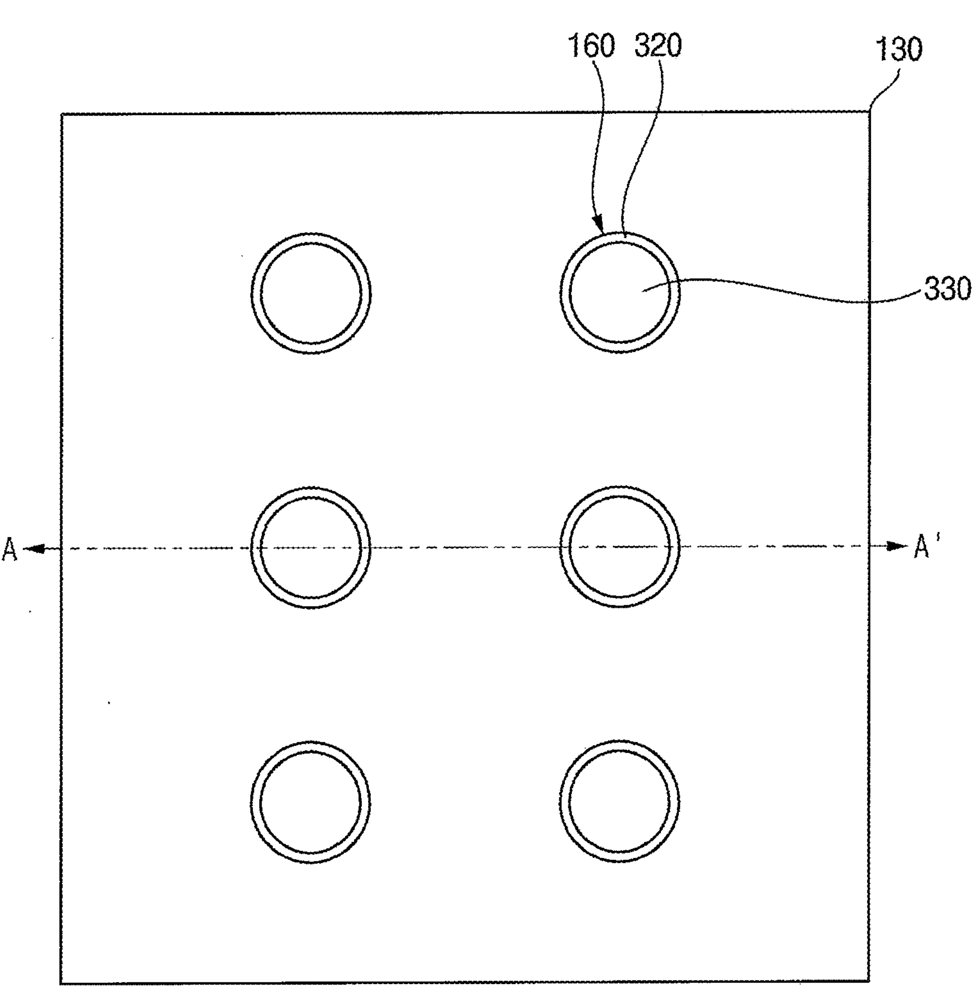
Figure 21:
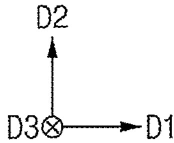
Figure 22:
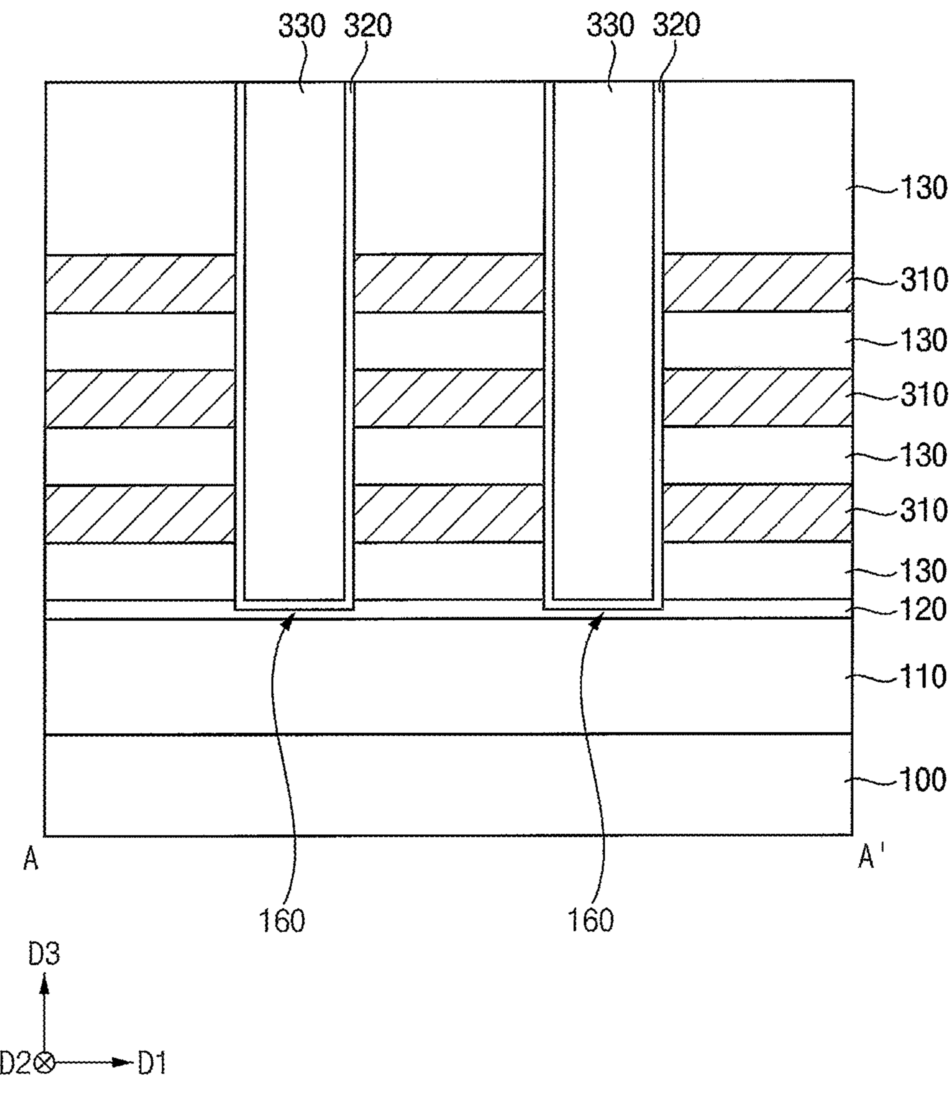
Figure 23:
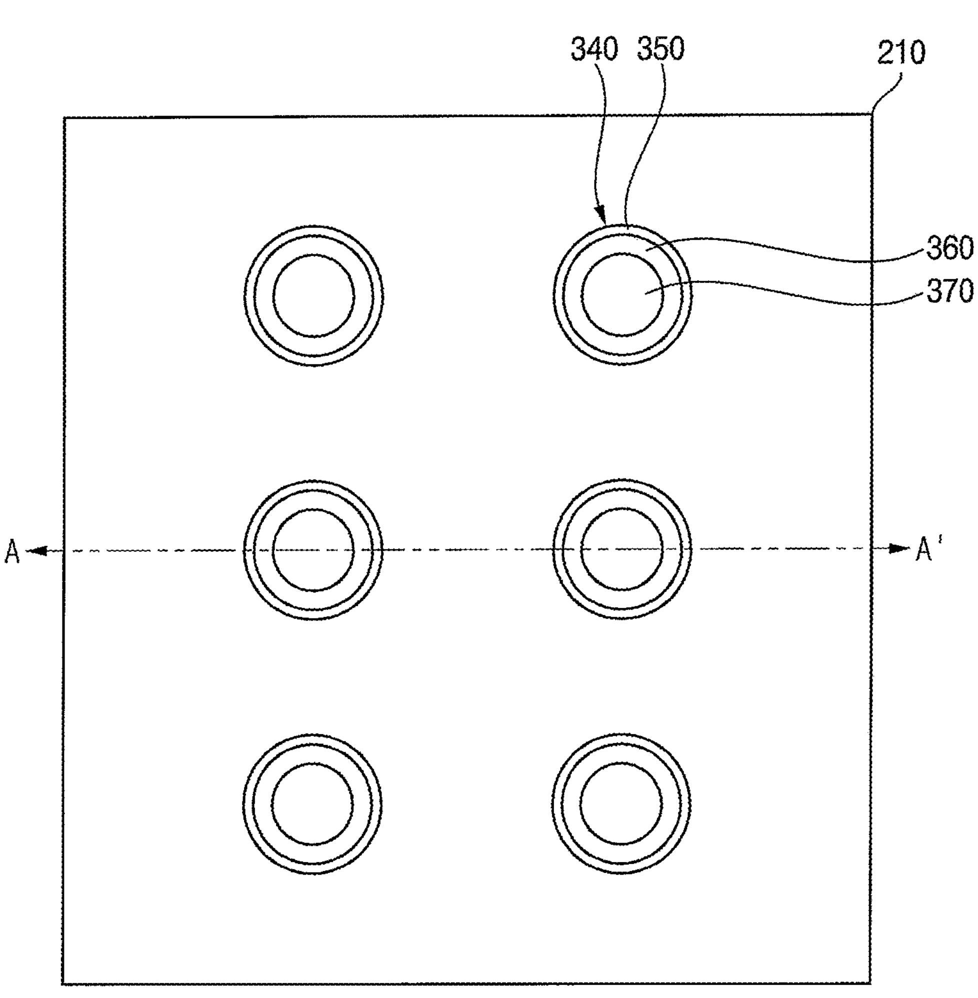
Figure 23:
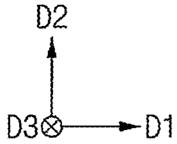

FIGS. 20 to 25 are plan views and cross-sectional views illustrating a method of manufacturing a 3D FeRAM device in accordance with some example embodiments. Particularly, FIGS. 21 and 23 are the plan views, and FIGS. 20, 22 and 24-25 are cross-sectional views taken along lines A-A' of corresponding plan views, respectively.

This method may include processes substantially the same as or similar to those illustrated with reference to FIGS. 1 to 16, and thus repeated explanations thereof are omitted herein.

Referring to FIG. 20, processes substantially the same as or similar to those illustrated with reference to FIGS. 3 and 4 may be performed.

However, a fourth electrode layer 310 may be formed instead of the first sacrificial layer 140, and the first electrode layer 150 and/or the first insulation layer 130 on the first electrode layer 150 may not be formed.

Referring to FIGS. 21 and 22, processes substantially the same as or similar to those illustrated with reference to FIGS. 5 and 6 may be performed.

However, the first gate insulation layer 170 may not be formed in the first hole 160, and a second ferroelectric layer 320 may be formed on the sidewall of the first hole 160 and/or the upper surface of the etch stop layer 120 exposed by the first hole 160.

Additionally, a fifth electrode 330 may be formed on the second ferroelectric layer 320 to fill a remaining portion of the first hole 160.

Figure 24:
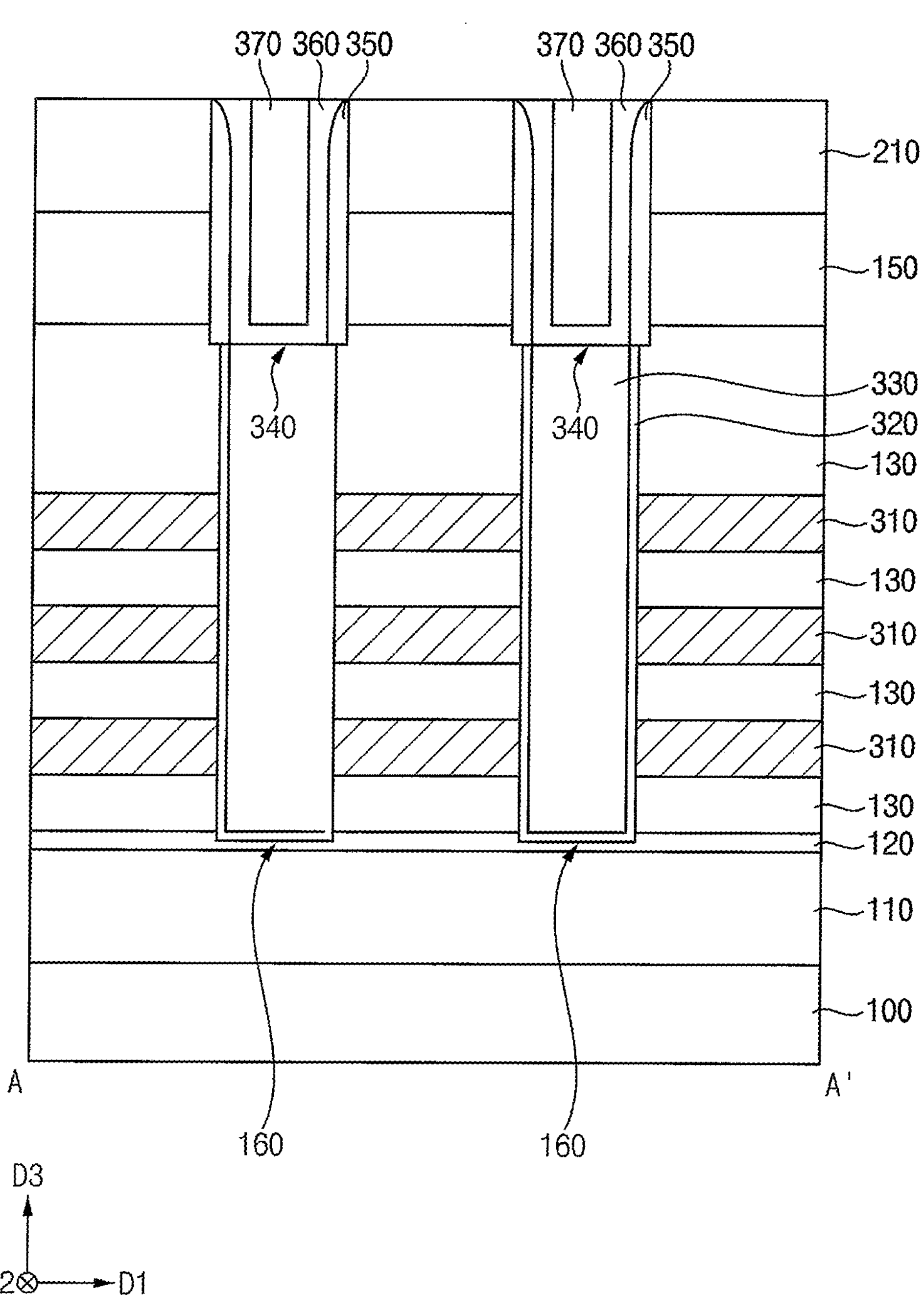

Referring to FIGS. 23 and 24, the first electrode layer 150 may be formed on the uppermost one of the first insulation layers 130, the second ferroelectric layer 320 and/or the fifth electrode 330, and a second insulating interlayer 210 may be formed on the first electrode layer 150.

A second hole 340 may be formed through the second insulating interlayer 210 and the first electrode layer 150 to expose upper surfaces of the second ferroelectric layer 320 and/or the fifth electrode 330, a second gate insulation layer 350 may be formed on a sidewall of the second hole 340, and/or a second channel layer 360 may be formed on an inner sidewall of the second gate insulation layer 350 and/or an upper surface of the fifth electrode 330. A second filling layer 370 may be formed on the second channel layer 360 to fill a remaining portion of the second hole 340.

Figure 25:
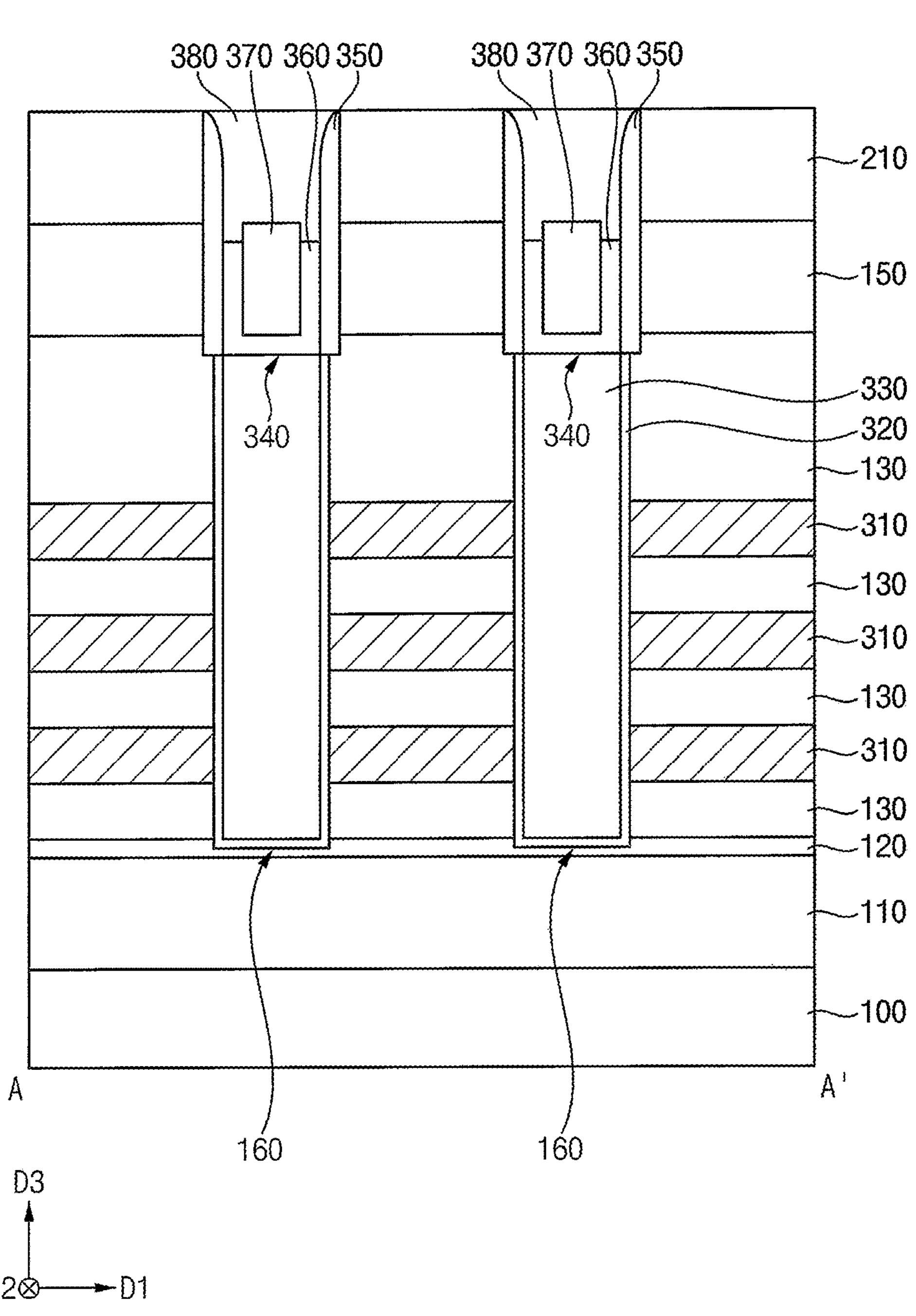

Referring to FIG. 25, processes substantially the same as or similar to those illustrated with reference to FIGS. 11 and 12 may be performed.

Thus, upper portions of the second filling layer 370 and the second channel layer 360 may be reduced, or removed, to form a second recess, and the second conductive pad 380 may be formed in the second recess.

In some example embodiments, a lower surface of the second conductive pad 380 may be substantially coplanar with the upper surface of the first electrode layer 150. Alternatively, the lower surface of the second conductive pad 380 may be higher or lower than the upper surface of the first electrode layer 150.

Referring to FIGS. 18 and 19 again, like the processes illustrated with reference to FIGS. 13 and 14, the third insulating interlayer 270 may be formed on the second insulating interlayer 210, the second conductive pad 380 and/or the second gate insulation layer 350, and for example, a dry etching process may be performed to form the opening 220 through the second and third insulating interlayers 210 and/or 270, the first insulation layers 130, the fourth electrode layers 310 and/or the first electrode layer 150 to expose the upper surface of the etch stop layer 120.

As the opening 220 is formed, the first insulation layer 1_30, the fourth electrode layer 310 and/or the first electrode layer 150 may be divided into first insulation patterns 135, the fourth electrodes 315 and/or the first electrodes 155, respectively, in the first direction D1.

The second insulation pattern 260 may be formed in the opening 220.

Processes substantially the same as or similar to those illustrated with reference to FIGS. 1 and 2 may be performed.

Thus, a fifth insulating interlayer 400 may be formed on the third insulating interlayer 270 and/or the second insulation pattern 260, and the contact plug 280 may be formed through the third and/or fifth insulating interlayers 270 and/or 400 to contact the upper surface of the second conductive pad 380.

A sixth insulating interlayer 410 may be formed on the fifth insulating interlayer 400 and/or the contact plug 280, and the bit line 300 may be formed through the sixth insulating interlayer 400 to contact the upper surface of the contact plug 280.

By the above processes, the 3D FeRAM device may be manufactured.

Figure 26:
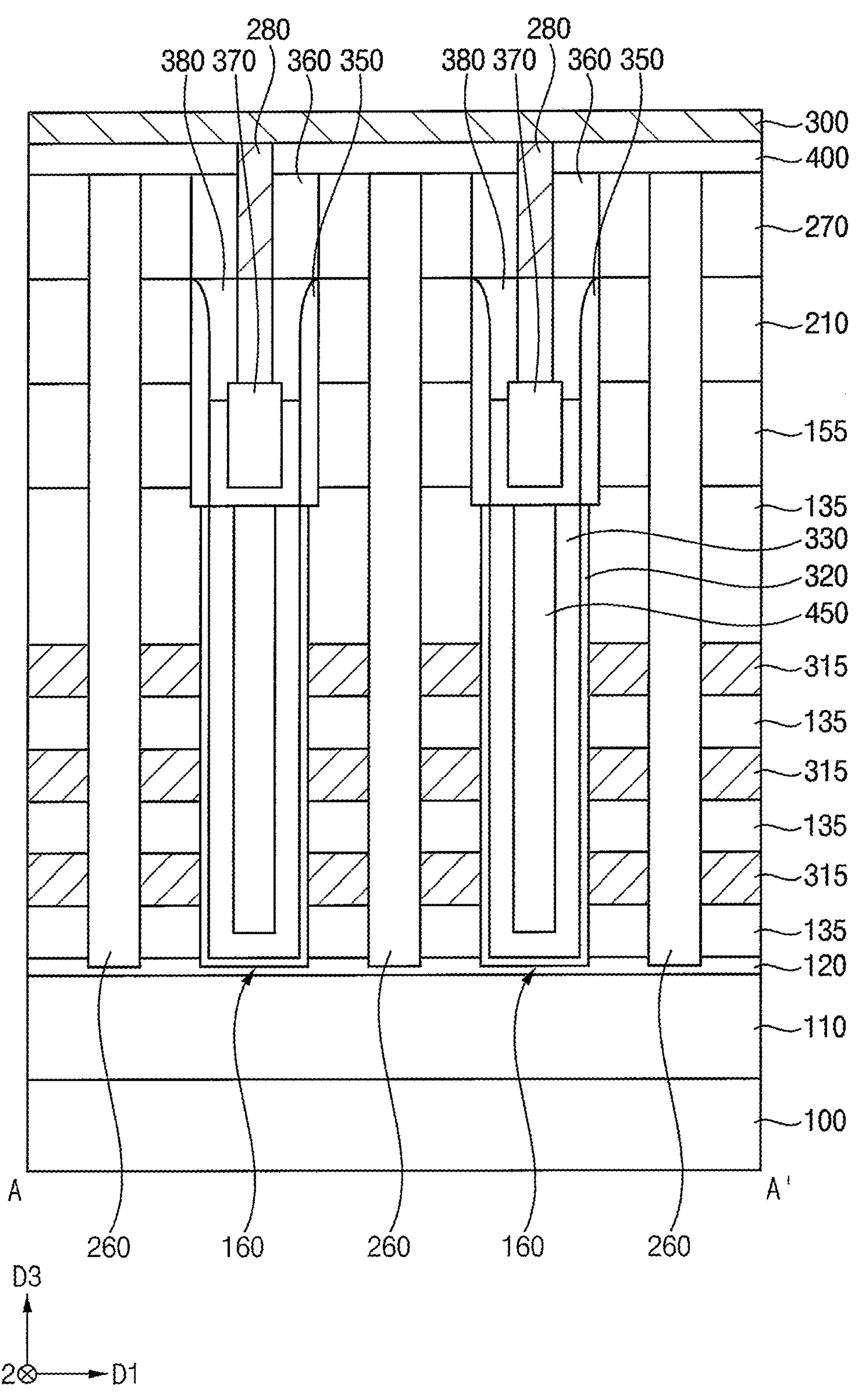
FIG. 26 is a cross-sectional view illustrating a 3D FeRAM device in accordance with some example embodiments.

FIG. 26 is a cross-sectional view illustrating a 3D FeRAM device in accordance with some example embodiments, which may correspond to FIG. 19.

This 3D FeRAM device may be substantially the same as or similar to that of FIGS. 18 and 19, except for further including a third filling layer 450 covered by the fifth electrode 330.

Referring to FIG. 26, the fifth electrode 330 may have a cup shape instead of a pillar shape, and the third filling layer 450 may be formed in a space defined by the fifth electrode 330.

A lower surface and a sidewall of the third filling layer 450 may be covered by the fifth electrode 330. The third filling layer 450 may include an oxide, e.g., silicon oxide, and/or an insulating nitride, e.g., silicon nitride.

While the inventive concepts have been shown and described with reference to some example embodiments thereof, it will be apparent to those of ordinary skill in the art that various modifications in form and details may be made thereto without departing from the spirit and scope of the inventive concepts as set forth by the following claims.

What is claimed is:

1. A 3D FeRAM device, comprising:
a capacitor structure including
a first capacitor electrode on a substrate, the first capacitor electrode extending in a vertical direction substantially perpendicular to an upper surface of the substrate,
a ferroelectric pattern surrounding a sidewall of the first capacitor electrode, and
second capacitor electrodes surrounding and contacting an outer sidewall of the ferroelectric pattern, the second capacitor electrodes being spaced apart from each other in the vertical direction;
an access transistor including
a channel layer on the first capacitor electrode,
a gate insulation layer surrounding an outer sidewall of the channel layer and a sidewall of a conductive pad, and
a gate electrode surrounding an outer sidewall of the gate insulation layer;
the conductive pad on the channel layer;
a contact plug on the conductive pad; and
a bit line on the contact plug.

2. The 3D FeRAM device of claim 1, wherein the conductive pad includes polysilicon doped with impurities.

3. The 3D FeRAM device of claim 1, further comprising a filling layer,
wherein the channel layer has a cup shape, and
wherein a lower surface and a sidewall of the filling layer are covered by the channel layer.

4. The 3D FeRAM device of claim 3, wherein an upper surface of the filling layer is higher than an uppermost surface of the channel layer.

5. The 3D FeRAM device of claim 1, wherein an upper surface of the channel layer is lower than an upper surface of the gate electrode.

6. The 3D FeRAM device of claim 1, further comprising a filling layer,
wherein the first capacitor electrode has a cup shape, and
wherein a lower surface and a sidewall of the filling layer is covered by the first capacitor electrode.

7. The 3D FeRAM device of claim 1, wherein each of the second capacitor electrodes extends in a second direction and the second capacitor electrodes are spaced apart from each other in a first direction at a same height, the first and second directions being substantially parallel to the upper surface of the substrate and crossing each other, and wherein the first capacitor electrode includes a plurality of first capacitor electrodes spaced apart from each other in the second direction.

8. The 3D FeRAM device of claim 7, wherein the bit line extends in the first direction, and the bit line is one of a plurality of bit lines spaced apart from each other in the second direction, wherein the conductive pad is one of a plurality of conductive pads, and wherein each bit line of the plurality of bit lines is electrically connected to corresponding ones of the plurality of conductive pads on corresponding ones of the plurality of first capacitor electrodes, respectively, in the first direction.

9. The 3D FeRAM device of claim 7, wherein the gate electrode extends in the second direction, and the gate electrode is one of a plurality of gate electrodes spaced apart from each other in the first direction.

10. A 3D FeRAM device, comprising:

first capacitor electrodes on a substrate, the first capacitor electrodes being spaced apart from each other in a vertical direction substantially perpendicular to an upper surface of the substrate;

a second capacitor electrode extending in the vertical direction through the first capacitor electrodes;

a ferroelectric pattern on a sidewall of the second capacitor electrode, the ferroelectric pattern contacting sidewalls of the first capacitor electrodes;

a gate electrode on an uppermost one of the first capacitor electrodes;

a channel layer extending through the gate electrode and contacting an upper surface of the second capacitor electrode, the channel layer having a cup shape;

a filling layer including a sidewall and a lower surface, the sidewall and the lower surface of the filling layer being covered by the channel layer;

a conductive pad contacting upper surfaces of the channel layer and the filling layer;

a gate insulation layer surrounding an outer sidewall of the channel layer and a sidewall of the conductive pad, the gate insulation layer contacting a sidewall of the gate electrode;

a contact plug on the conductive pad; and a bit line on the contact plug.

11. The 3D FeRAM device of claim 10, wherein each of the first capacitor electrodes and the gate electrode extend in a second direction substantially parallel to the upper surface of the substrate, and wherein the second capacitor electrode is one of a plurality of second capacitor electrodes spaced apart from each other in the second direction.

12. The 3D FeRAM device of claim 11, wherein:

the gate electrode is one of a plurality of gate electrodes spaced apart from each other in a first direction substantially parallel to the upper surface of the substrate and crossing the second direction, the first capacitor electrodes form a first capacitor electrode group, and the first capacitor electrode group is one of a plurality of first capacitor electrode groups spaced apart from each other in the first direction, and the bit line extends in the first direction, and contacts upper surfaces of the contact plugs.

* * * * *